(12) United States Patent
Pan et al.

(10) Patent No.: US 11,678,562 B2
(45) Date of Patent: Jun. 13, 2023

(54) METHODS AND SYSTEMS OF ORGANIC SEMICONDUCTING POLYMERS

(71) Applicant: PHILLIPS 66 COMPANY, Houston, TX (US)

(72) Inventors: Hualong Pan, Bartlesville, OK (US); Kathy A. Repa, Bartlesville, OK (US); Brian J. Worfolk, Bartlesville, OK (US); Alyssa Brooke Chinen-Mendez, Bartlesville, OK (US)

(73) Assignee: Phillips 66 Company, Houston, TX (US)

( * ) Notice: Subject to any disclaimer, the term of this patent is extended or adjusted under 35 U.S.C. 154(b) by 470 days.

(21) Appl. No.: 17/003,066

(22) Filed: Aug. 26, 2020

(65) Prior Publication Data

US 2021/0066610 A1     Mar. 4, 2021

Related U.S. Application Data

(60) Provisional application No. 62/892,380, filed on Aug. 27, 2019.

(51) Int. Cl.
*H10K 85/10* (2023.01)
*C08K 9/04* (2006.01)
(Continued)

(52) U.S. Cl.
CPC ......... *H10K 85/113* (2023.02); *C08G 61/126* (2013.01); *C08K 3/045* (2017.05);
(Continued)

(58) Field of Classification Search
CPC .. H10K 85/113; H10K 85/151; H10K 85/215; H10K 85/6576; H10K 30/00;
(Continued)

(56) References Cited

U.S. PATENT DOCUMENTS 10,074,804 B2    9/2018   Nishihara et al.

OTHER PUBLICATIONS

"Non-Halogenated solvent processed highly efficient organic solar cells with a record open circuit voltage enabled by noncovalently locked novel polymer donors" J. Mater. Chem. A. 2019, 7, 27394-27402 (Year: 2019).*

\* cited by examiner

*Primary Examiner* — Andrew J. Oyer
(74) *Attorney, Agent, or Firm* — Phillips 66 Company

(57) ABSTRACT

An organic photovoltaic device comprising a polymer:

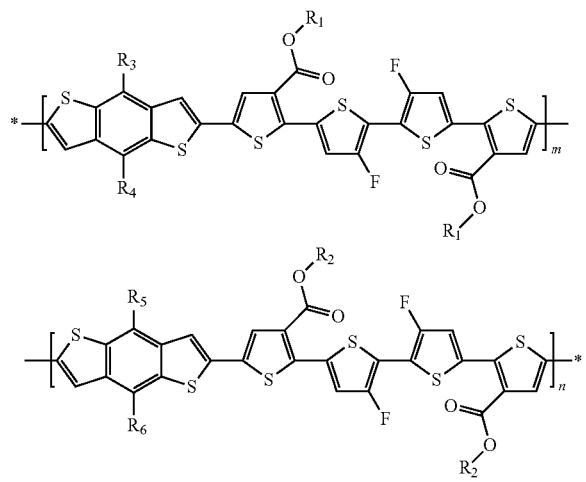

and an acceptor. In this organic photovoltaic device, $R_1$, $R_2$, $R_3$, $R_4$, $R_5$ and $R_6$ are independently selected from the group consisting of: a halogen, a substituted alkyl, an unsubstituted (Continued)

CONVENTIONAL
DEVICE ARCHITECTURE

INVERTED
DEVICE ARCHITECTURE alkyl, a substituted aryl, an unsubstituted aryl, a substituted heteroaryl and an unsubstituted heteroaryl.

5 Claims, 27 Drawing Sheets

(51) Int. Cl.
*C08K 3/04* (2006.01)
*C08G 61/12* (2006.01)
*H10K 85/20* (2023.01)
*H10K 85/60* (2023.01)
*H10K 30/00* (2023.01)
*H10K 50/15* (2023.01)
*H10K 50/16* (2023.01)

(52) U.S. Cl.
CPC ............. *C08K 9/04* (2013.01); *H10K 85/151* (2023.02); *H10K 85/215* (2023.02); *H10K 85/6576* (2023.02); *C08G 2261/122* (2013.01); *C08G 2261/145* (2013.01); *C08G 2261/149* (2013.01); *C08G 2261/1426* (2013.01); *C08G 2261/18* (2013.01); *C08G 2261/228* (2013.01); *C08G 2261/314* (2013.01); *C08G 2261/3223* (2013.01); *C08G 2261/3243* (2013.01); *C08G 2261/334* (2013.01); *C08G 2261/411* (2013.01); *C08G 2261/51* (2013.01); *C08G 2261/514* (2013.01); *C08G 2261/91* (2013.01); *C08K 2201/001* (2013.01); *C08K 2201/011* (2013.01); *H10K 30/00* (2023.02); *H10K 50/15* (2023.02); *H10K 50/16* (2023.02)

(58) Field of Classification Search
CPC ...... H10K 50/15; H10K 50/16; C08G 61/126; C08G 2261/122; C08G 2261/1426; C08G 2261/145; C08G 2261/149; C08G 2261/18; C08G 2261/228; C08G 2261/314; C08G 2261/3223; C08G 2261/3243; C08G 2261/334; C08G 2261/411; C08G 2261/51; C08G 2261/514; C08G 2261/91; C08G 2261/124; C08G 2261/1412; C08G 2261/146; C08G 2261/364; C08G 2261/414; C08G 61/122; C08K 3/045; C08K 9/04; C08K 2201/001; C08K 2201/011; C09D 165/00; Y02E 10/549; H01L 51/0043; H01L 51/0036; H01L 51/0047; H01L 51/4253
See application file for complete search history.

METHODS AND SYSTEMS OF ORGANIC SEMICONDUCTING POLYMERS

CROSS-REFERENCE TO RELATED APPLICATIONS

This application is a non-provisional application which claims the benefit of and priority to U.S. Provisional Application Ser. No. 62/892,380 filed Aug. 27, 2019, titled "Methods and Systems of Organic Semiconducting Polymers," which is hereby incorporated by reference in its entirety.

STATEMENT REGARDING FEDERALLY SPONSORED RESEARCH OR DEVELOPMENT

None.

FIELD OF THE INVENTION

This invention relates methods of synthesis of organic semiconducting polymers.

BACKGROUND OF THE INVENTION

Solar energy using photovoltaics requires active semiconducting materials to convert light into electricity. Currently, solar cells based on silicon are the dominating technology due to their high power conversion efficiency. Recently, solar cells based on organic materials showed interesting features, especially on the potential of low cost in materials and processing.

Organic photovoltaic cells have many potential advantages when compared to traditional silicon-based devices. Organic photovoltaic cells are light weight, economical in the materials used, and can be deposited on low cost substrates, such as flexible plastic foils. However, organic photovoltaic devices typically have relatively low power conversion efficiency (the ratio of incident photons to energy generated).

There exists a need for a polymer to create organic photovoltaic cells that has high power conversion efficiency while maintaining open-circuitry voltage short-circuit current density, and fill factor.

BRIEF SUMMARY OF THE DISCLOSURE

An organic photovoltaic device comprising a polymer:

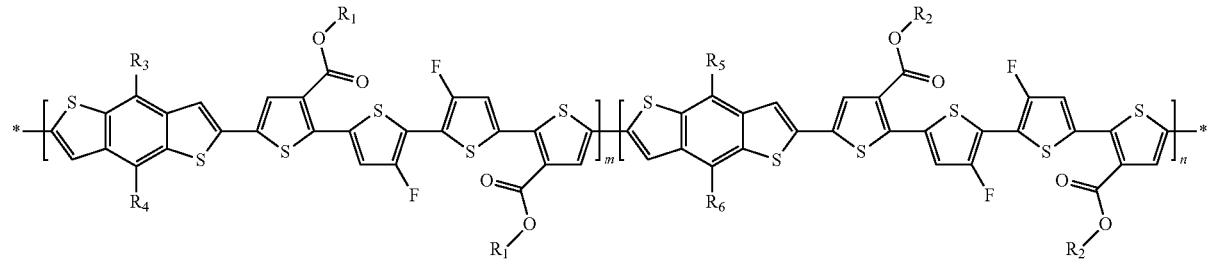

and an acceptor. In this organic photovoltaic device, $R_1$, $R_2$, $R_3$, $R_4$, $R_5$ and $R_6$ are independently selected from the group consisting of: a halogen, a substituted alkyl, an unsubstituted alkyl, a substituted aryl, an unsubstituted aryl, a substituted heteroaryl and an unsubstituted heteroaryl.

In another embodiment, an organic photovoltaic device is taught made from a polymer:

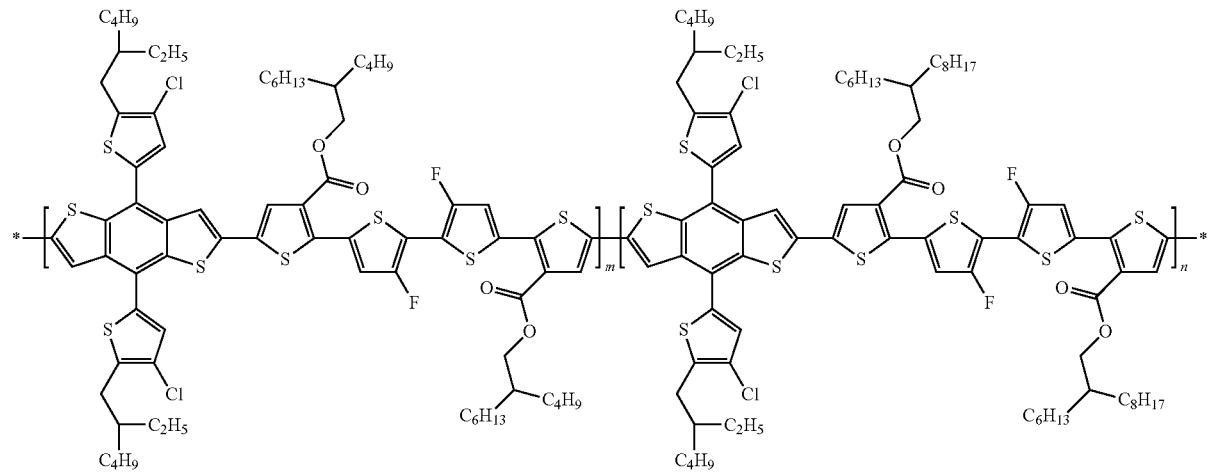

and an acceptor, wherein the polymer was formed in a naptha solvent.

BRIEF DESCRIPTION OF THE DRAWINGS

A more complete understanding of the present invention and benefits thereof may be acquired by referring to the follow description taken in conjunction with the accompanying drawings in which.

DETAILED DESCRIPTION

Figure 1:
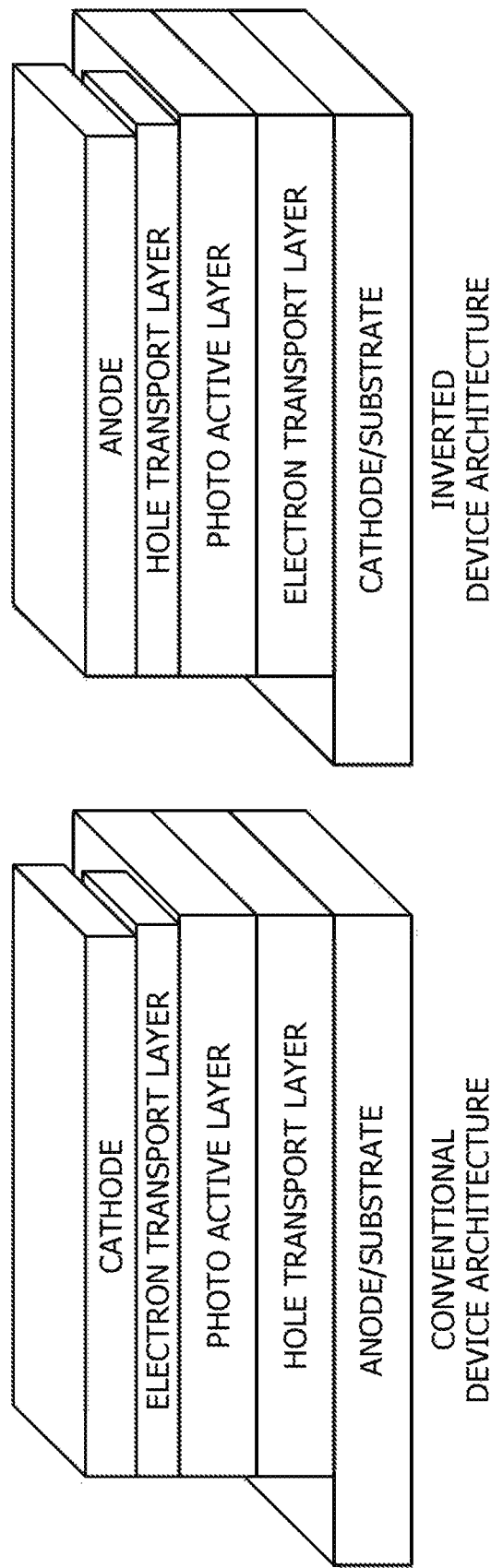
FIG. 1 depicts a conventional device architecture and an inverted device architecture.

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment the aliphatic hydrocarbon chains are of 1 to about 100 carbon atoms, preferably 1 to 30 carbon atoms, more preferably, 1 to 20 carbon atoms, and even more preferably, and includes straight and branched chains such as methyl, ethyl, n-propyl, isopropyl, n-butyl, isobutyl, sec-butyl, t-butyl, n-pentyl, isopentyl, neo-pentyl, n-hexyl, and isohexyl. In this application alkyl groups can include the possibility of substituted and unsubstituted alkyl groups.

"Alkylthiol," as used herein, refers to alkyl groups with a sulfanyl group (—SH) attached.

"Alkoxy," as used herein, refers to the group R—O— where R is an alkyl group of 1 to 100 carbon atoms. In this application alkoxy groups can include the possibility of substituted and unsubstituted alkoxy groups.

"Aryl" as used herein, refers to an optionally substituted, mono-, di-, tri-, or other multicyclic aromatic ring systems or heteroaryl systems having from about 5 to about 50 carbon atoms (and all combinations and subcombinations of ranges and specific numbers of carbon atoms therein), with from about 6 to about 20 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups, fused aryl, and heteroaryl groups.

"Heteroaryl" as used herein, reference to a heterocyclyl group derived from a heteroarene by removal of a hydrogen atom from any ring atom. Non-limiting substitutions of the ring atom can be S, O, Te, Se, N, P, Si, Ge, B, and As.

"Ester", as used herein, represents a group of formula —COOR wherein R represents an "alkyl", "aryl", a "heterocycloalkyl" or "heteroaryl" moiety, or the same substituted as defined above.

"Ketone" as used herein, represents an organic compound having a carbonyl group linked to a carbon atom such as —C(O)Rx wherein Rx can be alkyl, aryl, cycloalkyl, cycloalkenyl or heterocycle.

"Amide" as used herein, represents a group of formula "—C(O)NR$^x$R$^y$," wherein R$^x$ and R$^y$ can be the same or independently H, alkyl, aryl, cycloalkyl, cycloalkenyl or heterocycle.

The following examples of certain embodiments of the invention are given. Each example is provided by way of explanation of the invention, one of many embodiments of the invention, and the following examples should not be read to limit, or define, the scope of the invention.

Device Architecture

When used as a photovoltaic device the architecture may be a conventional architecture device, while in others it may be an inverted architecture device. A conventional architecture device typically comprised of multilayered structure with a transparent anode as a substrate to collect positive charge (holes) and a cathode to collect negative charge (electrons), and a photo-active layer sandwiched in between two electrodes. An additional charge transport interlayer is inserted in between active layer and electrode for facile hole and electron transport. Each charge transport layer can be consisted of one or more layers. An inverted device has the same multilayered structure as the conventional architecture device whereas it uses a transparent cathode as a substrate to collect electrons and an anode to collect holes. The inverted device also has the photo-active layer and additional charge transport layers sandwiched in between two electrodes. FIG. 1 depicts a conventional device architecture and an inverted device architecture.

Constitutional Units to Form Monomers

A variety of constitutional units, or comonomers, that can be used to create the monomers for the organic semiconducting polymers. On example of a constitutional unit can unit A

A new embodiment

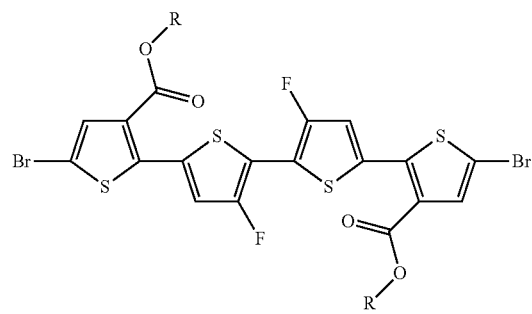

can be formed when two

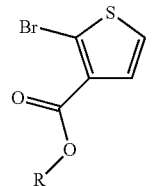

is attached to

Figure 2:
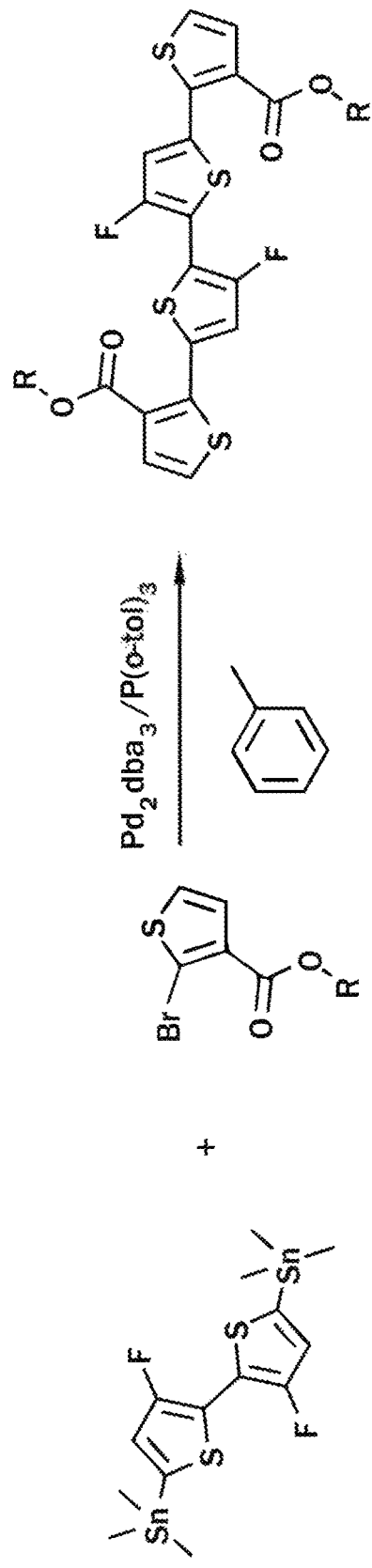
FIG. 2 depicts a reaction mechanism.
Figure 3:
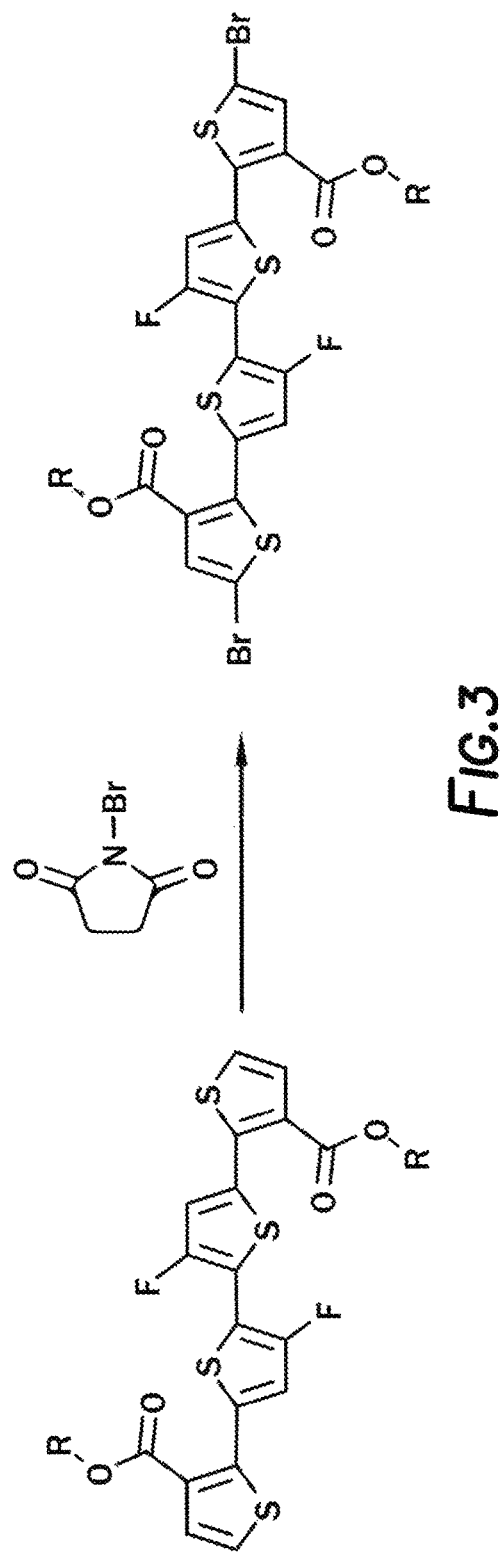
FIG. 3 depicts a reaction mechanism.

One embodiment in which this polymer can be formed is shown in FIG. 2. In FIG. 2, R is selected from or a linear or branched aliphatic group (e.g., an alkyl group, an alkenyl group, an alkoxy group, or an alkylthio group) having 6-20 carbon atoms. straight-chain carbyl, silyl or hydrocarbyl, branched, cyclic alkyl with 1 to 30 atoms, fused rings, which can be optionally substituted with one or more X or X' groups. X or X' groups can be H, F, Cl, CN. After bromination, a new monomer will be formed. This bromination step is shown in FIG. 3.

Figure 4:
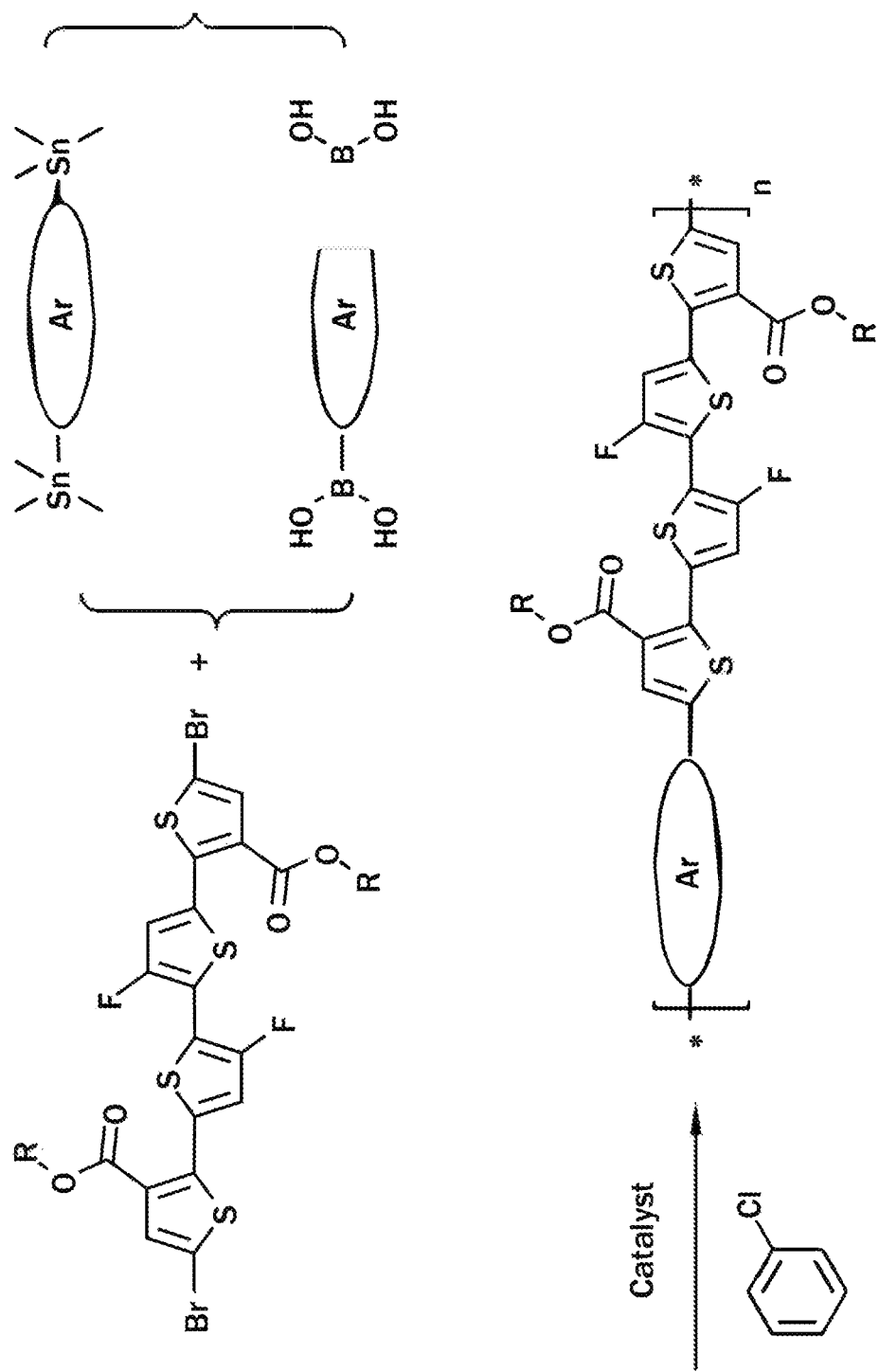
FIG. 4 depicts a reaction mechanism.

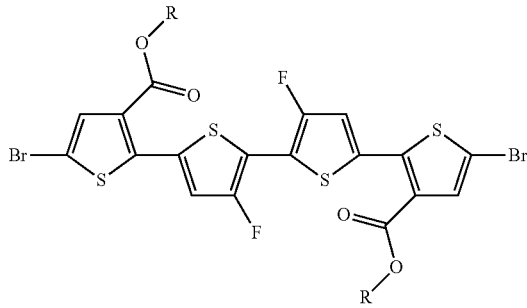

can react with any aromatic bistin or bis-boronic acid monomer to form a new kind of semiconducting polymers as shown in FIG. 4.

Examples of aryl groups for FIG. 4 can include aryl groups such as polycyclic heteroaryl groups other aryl groups can include:

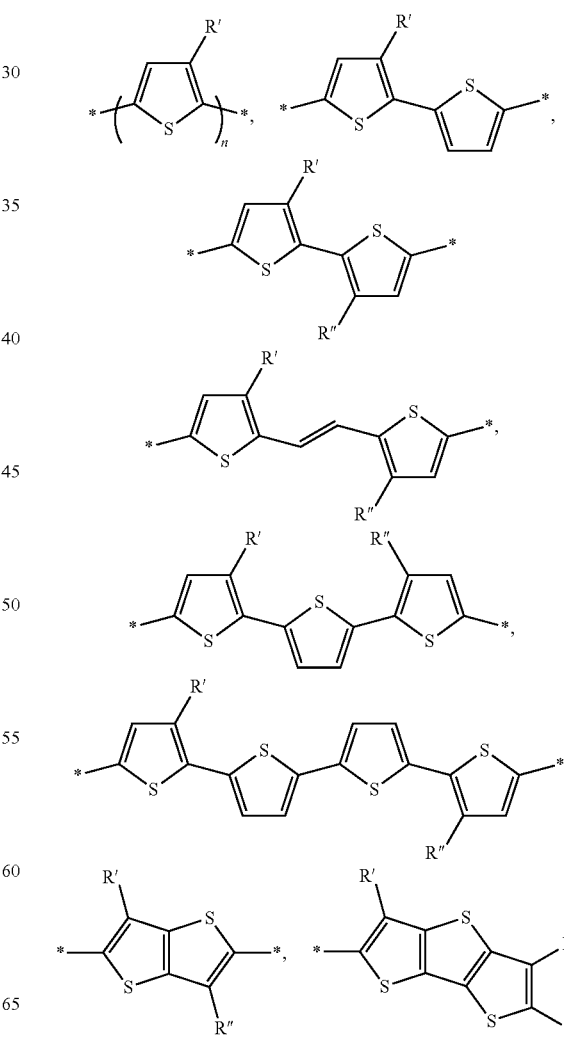

-continued
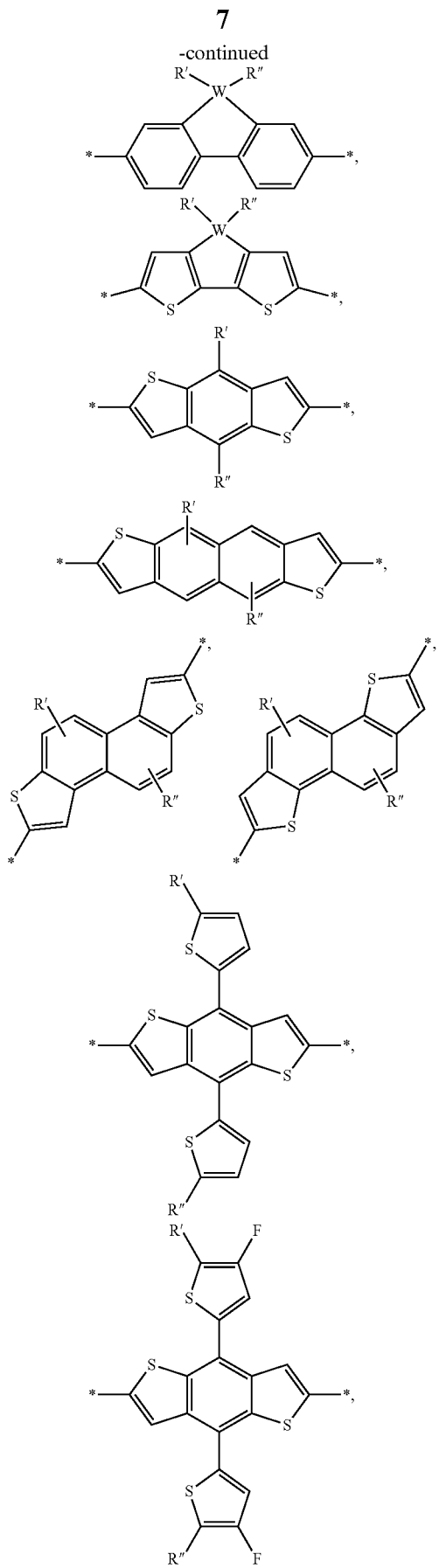
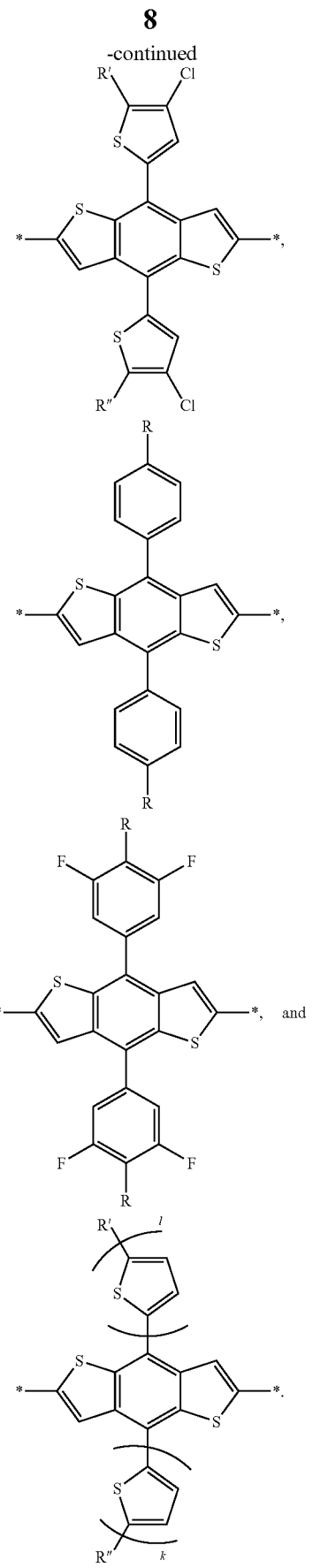

In the above examples W can be C, Si or Se. R', R" can be independently selected from H, Cl, F, CN, an alkyl group, an alkoxy group, an aryl group, a $C_{6-20}$ alkyl group, a —O—$C_{6-20}$ alkyl group, a —O—$C_{6-20}$ alkenyl group, a —O—$C_{6-20}$ haloalkyl group, a —S—$C_{6-20}$ alkyl group, a —S—$C_{6-20}$ alkenyl group, a —S—$C_{6-20}$ haloalkyl group, a -thienyl-$C_{6-20}$ alkyl group, a -thienyl-$C_{6-20}$ alkenyl group, and a -thienyl-$C_{6-20}$ haloalkyl group Polymer Synthesis From the above constitutional units or comonomers, any conventionally known coupling reaction can be used to make monomers. Examples of different coupling reactions that can be used include, Wurtz reaction, Glaser coupling, Ullman reaction, Gomberg-Bachmann reaction, Cadiot-Chodkiewicz coupling, Pinacol coupling reaction, Castro-Stephens coupling, Gilman reagent coupling, Cassar reaction, Kumada coupling, Heck reaction, Sonogashira coupling, Negishi coupling, Stile coupling, Suzuki reaction, Hiyama coupling, Buchwald-Hartwig reaction, Fukuyama coupling, Liebeskind-Srogl coupling, Direct Heteroarylation and MacMillan coupling.

Examples of monomer and polymer synthesis

Figure 5:
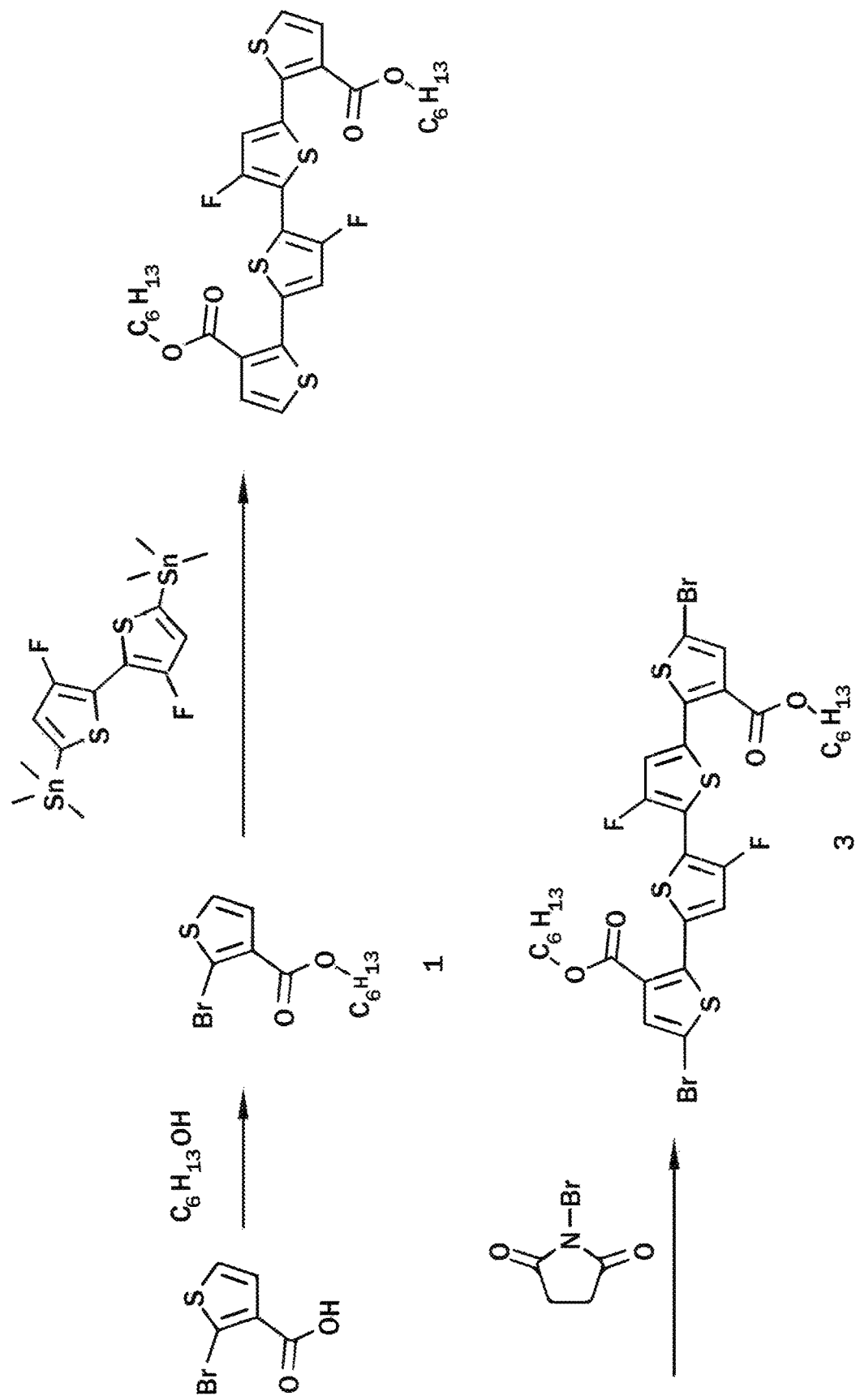
FIG. 5 depicts a reaction mechanism.
Figure 6:
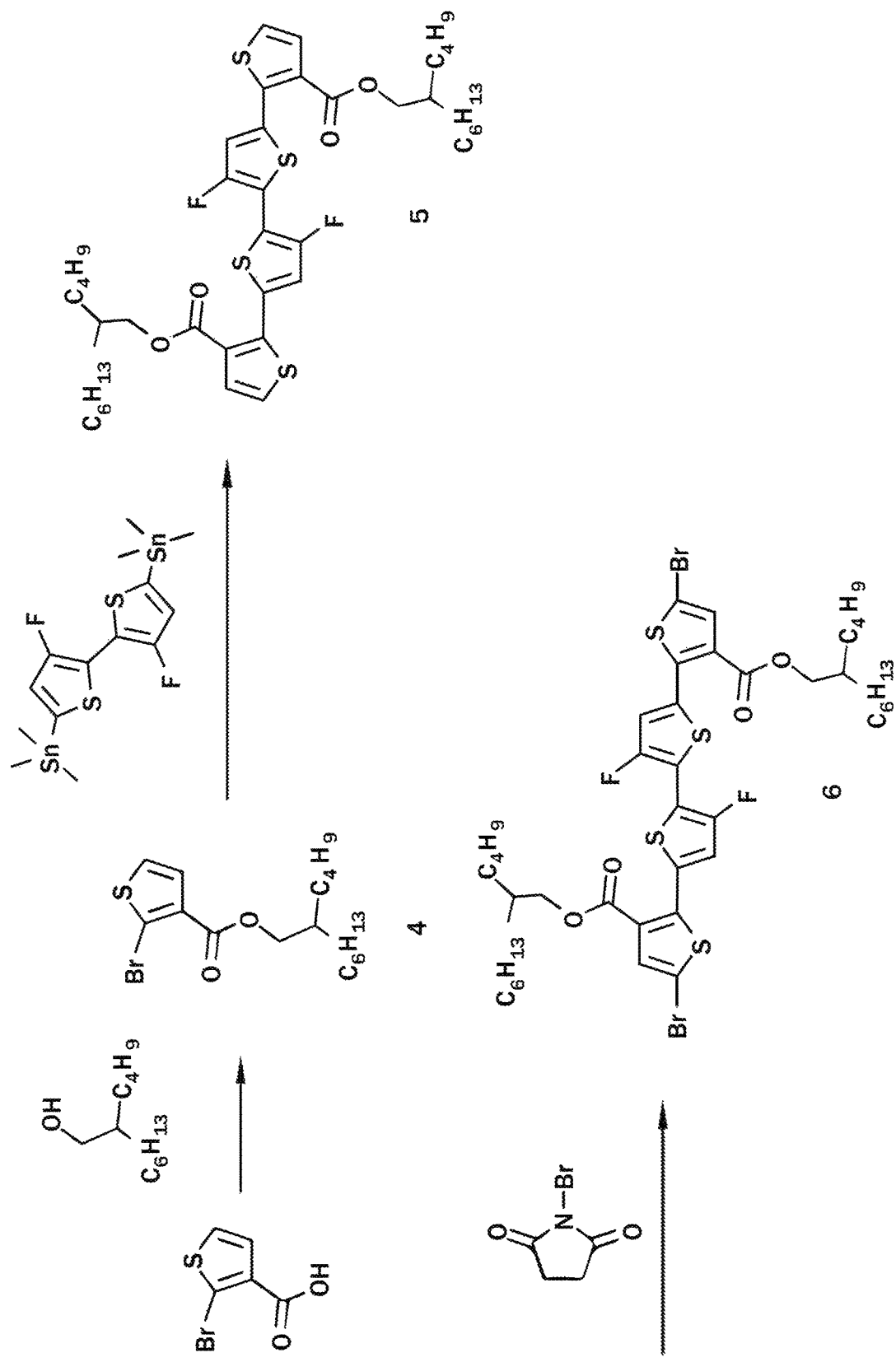
FIG. 6 depicts a reaction mechanism.

The synthesis scheme for polymer A, B, C and D with the intermediate compounds 1, 2, 3, 4, 5, and 6 are shown in FIG. 5 and FIG. 6.

Figure 7:
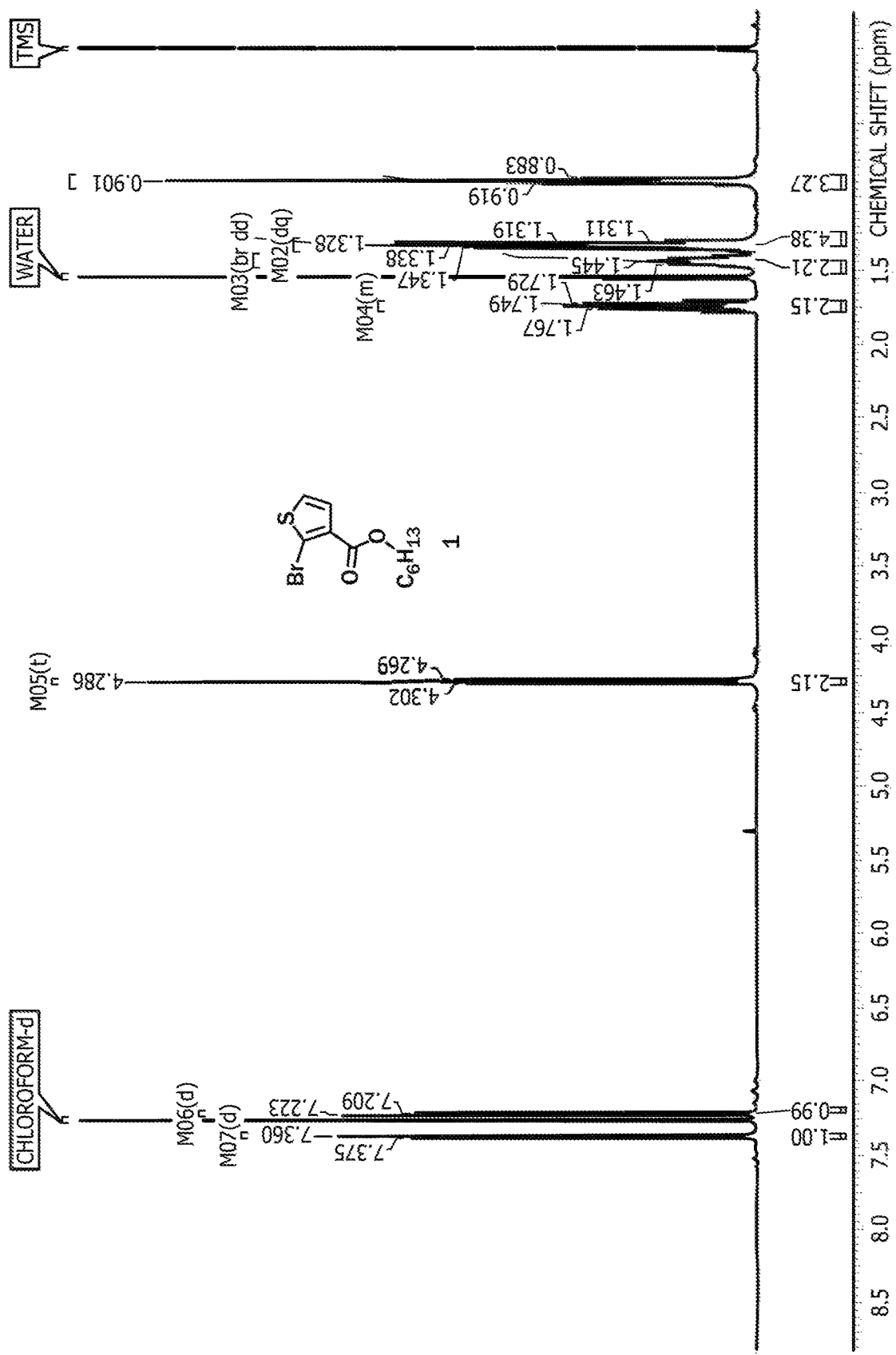
FIG. 7 depicts spectra of hexyl 2-bromothiophene-3-carboxylate.
Figure 8:
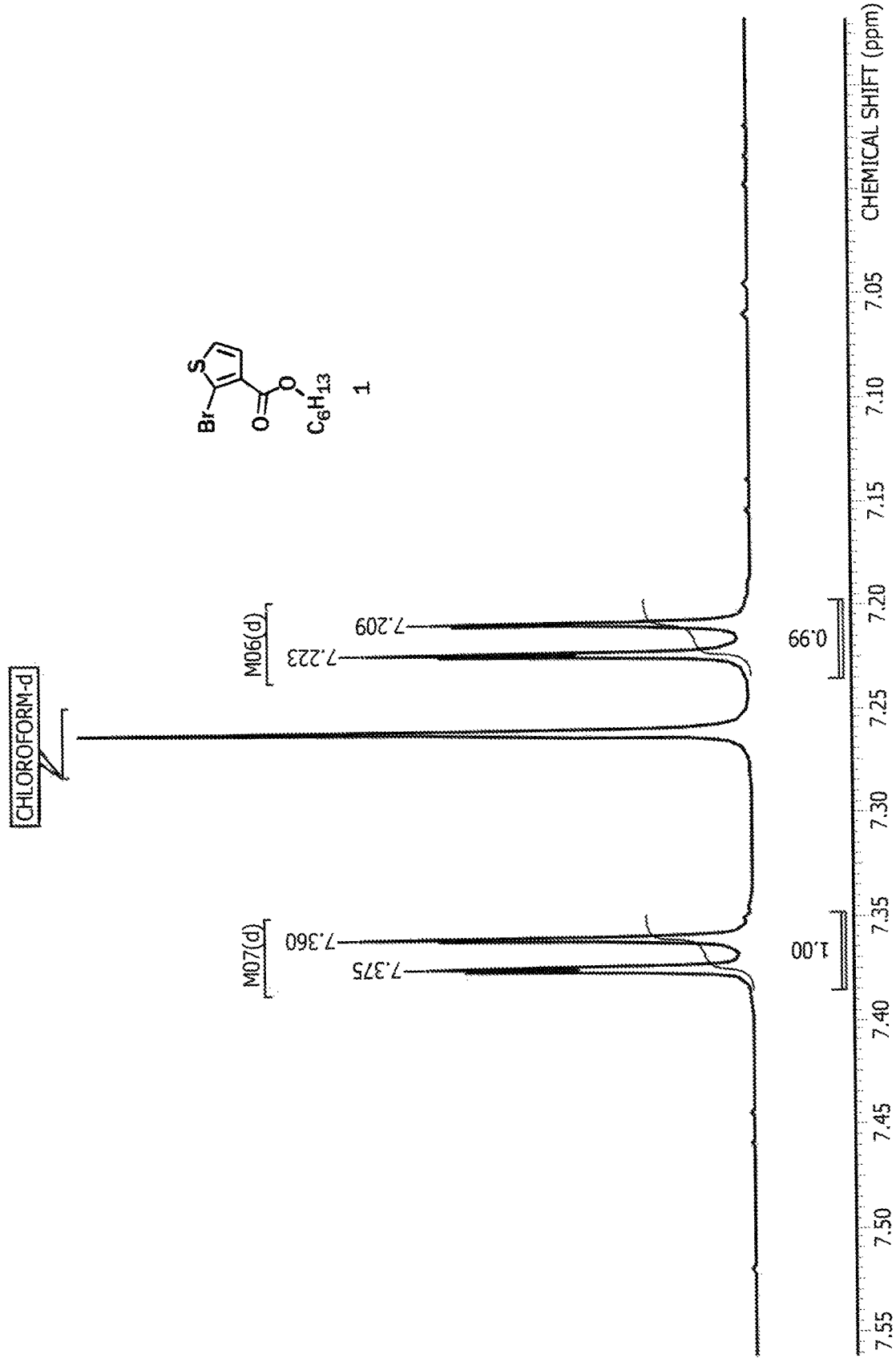
FIG. 8 depicts spectra of hexyl 2-bromothiophene-3-carboxylate.

Synthesis of intermediate compound 1 hexyl 2-bromothiophene-3-carboxylate: 2-bromothiophene-3-carboxylic acid (5 g, 0.024 mol), 1-hexanol (4.935 g, 0.048 mol), 4-dimethylaminopyridine (0.59 g, 0.005 mol), dicyclohexylcarbodiimide DCC (5.979 g, 0.029 mol) were combined in a 100 mL Schlenk flask. The system was degassed and backfilled with Argon three times before 60 mL of anhydrous dichloromethane was added. The mixture was stirred at room temperature overnight. The mixture was dry loaded into silica gel and purified by silica gel chromatography. Colorless liquid (6.57 g, yield, 93.4%) was obtained as product. The $^1$H NMR spectrum of compound hexyl 2-bromothiophene-3-carboxylate in CDCl$_3$ is shown in FIG. 7. FIG. 8 depicts a $^1$NMR spectrum of the aromatic region of compound hexyl 2-bromothiophene-3-carboxylate in CDCl$_3$.

Figure 9:
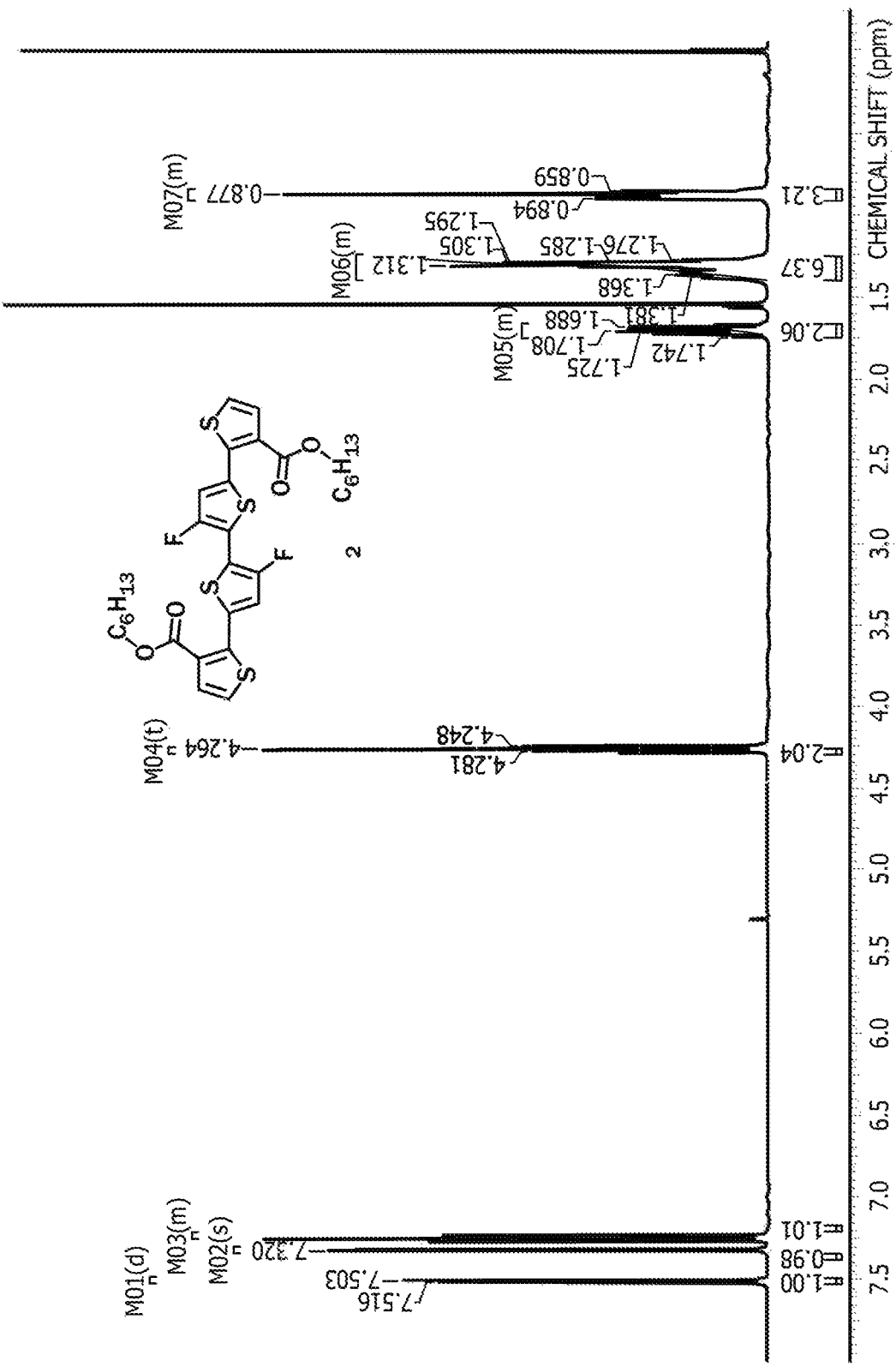
FIG. 9 depicts spectra of dihexyl 3",4'-difluoro-[2,2':5',2":5",2"'-quaterthiophene]-3,3"'-dicarboxylate.
Figure 10:
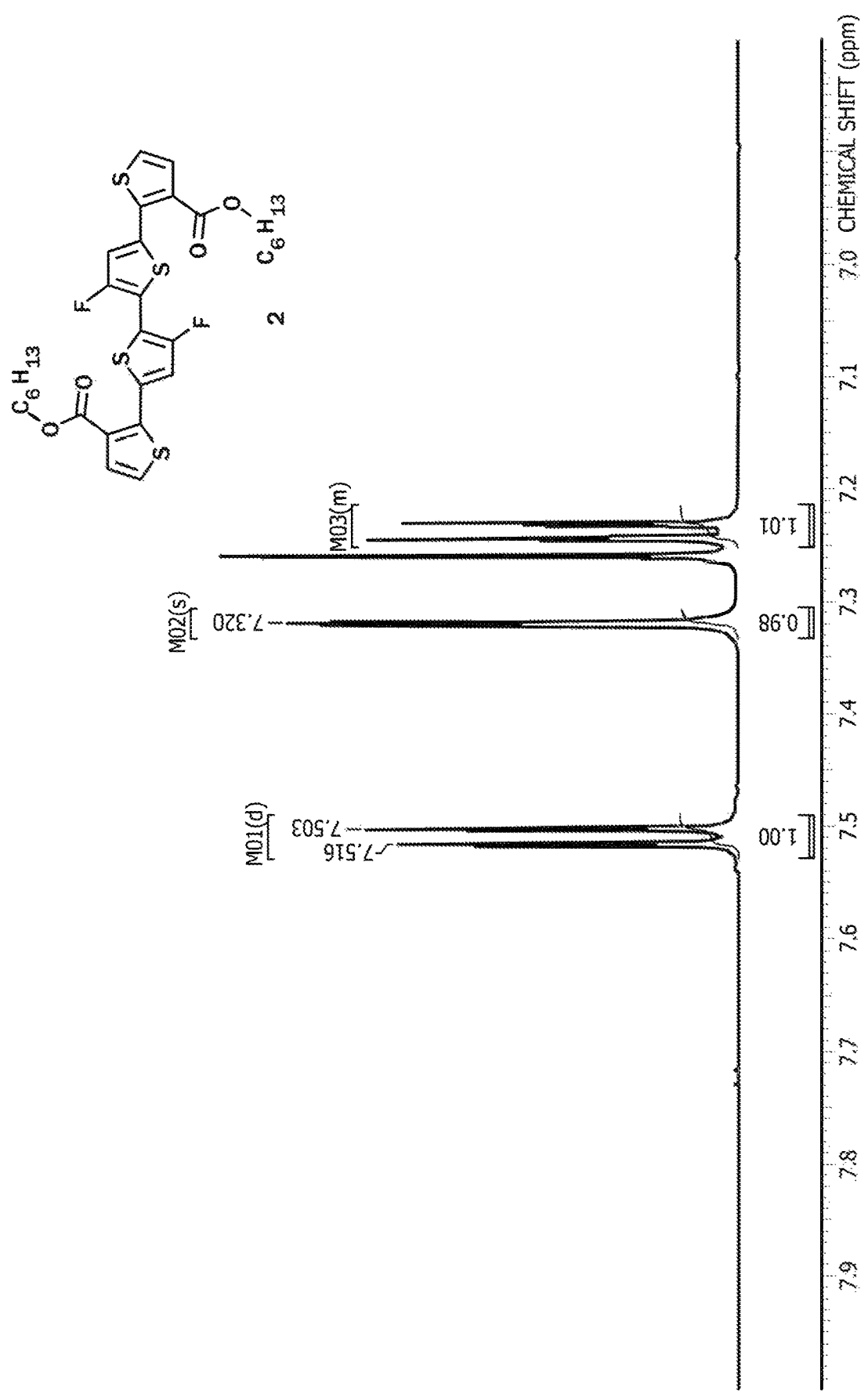
FIG. 10 depicts spectra of dihexyl 3",4'-difluoro-[2,2':5',2":5",2"'-quaterthiophene]-3,3"'-dicarboxylate.

Synthesis of intermediate compound 2 dihexyl 3",4'-difluoro-[2,2':5',2":5",2"'-quaterthiophene]-3,3"'-dicarboxylate: In a 100-mL Schlenk flask, compound hexyl 2-bromothiophene-3-carboxylate (2.427 g, 8.34 mmol), (3,3'-difluoro-[2,2'-bithiophene]-5,5'-diyl)bis(trimethylstannane) (2 g, 3.79 mmol), Pd$_2$dba$_3$ (69 mg, 0.076 mmol) and P(o-tol)$_3$ (92 mg, 0.30 mmol) were added. The mixture was degassed with argon twice before 30 mL of anhydrous toluene was added. The solution was heated at 105° C. for 24 hours. After removal of solvent, the crude product was purified by column chromatography on silica gel using a mixture of dichloromethane and hexane (3:1) as eluent to afford pure product (2.2 g, 12.1%) as an orange solid. The $^1$H NMR spectrum of compound dihexyl 3",4'-difluoro-[2,2':5',2":5",2"'-quaterthiophene]-3,3"'-dicarboxylate in CDCl$_3$ is provided in FIG. 9. FIG. 10 depicts an $^1$H NMR spectrum of the aromatic region of compound dihexyl 3",4'-difluoro-[2,2':5',2":5",2"'-quaterthiophene]-3,3"'-dicarboxylate in CDCl$_3$.

Figure 11:
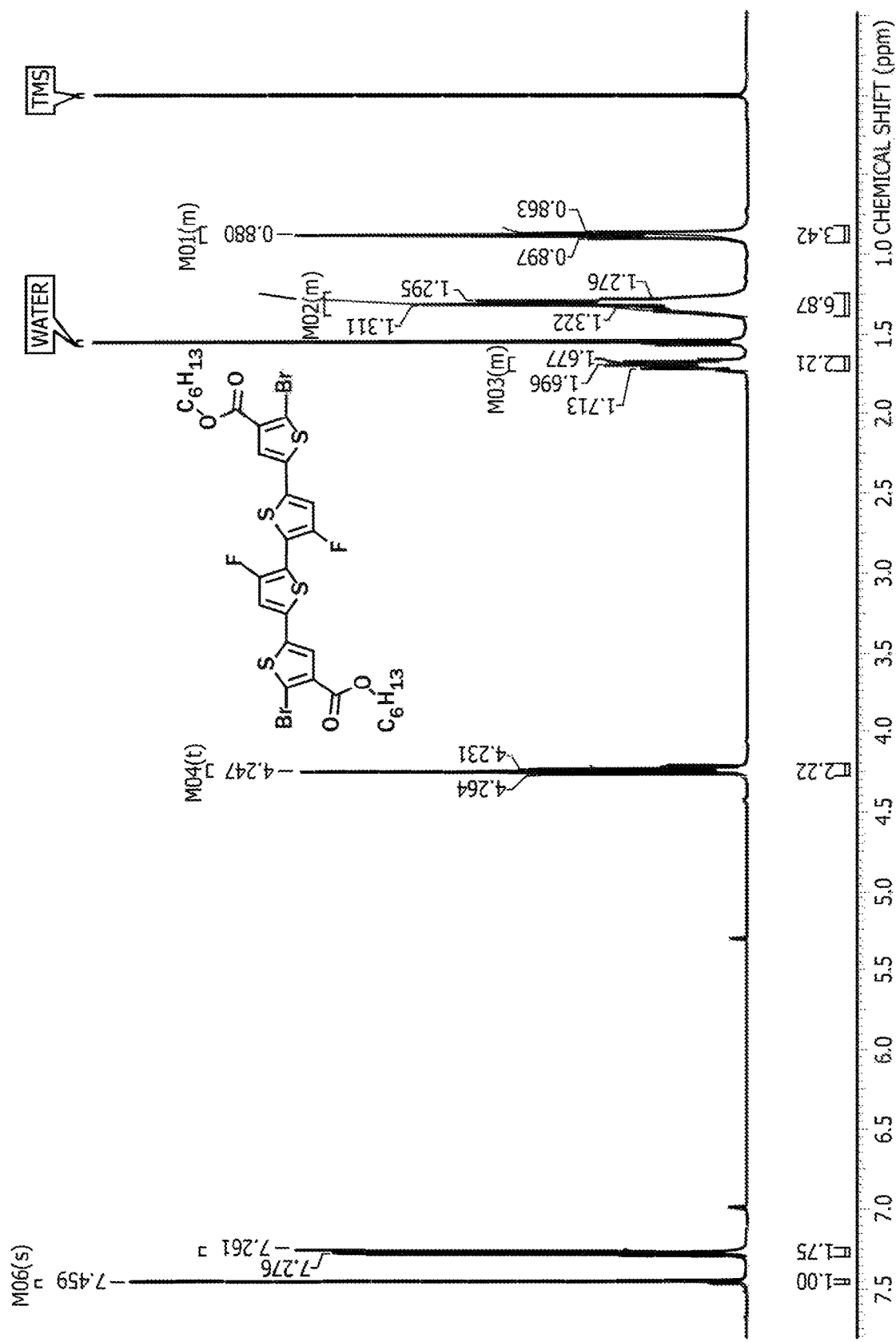
FIG. 11 depicts spectra of 5,5"'-dibromo-3",4'-difluoro-[2,2':5',2":5",2"'-quaterthiophene]-3,3 "'-dicarboxylate.
Figure 12:
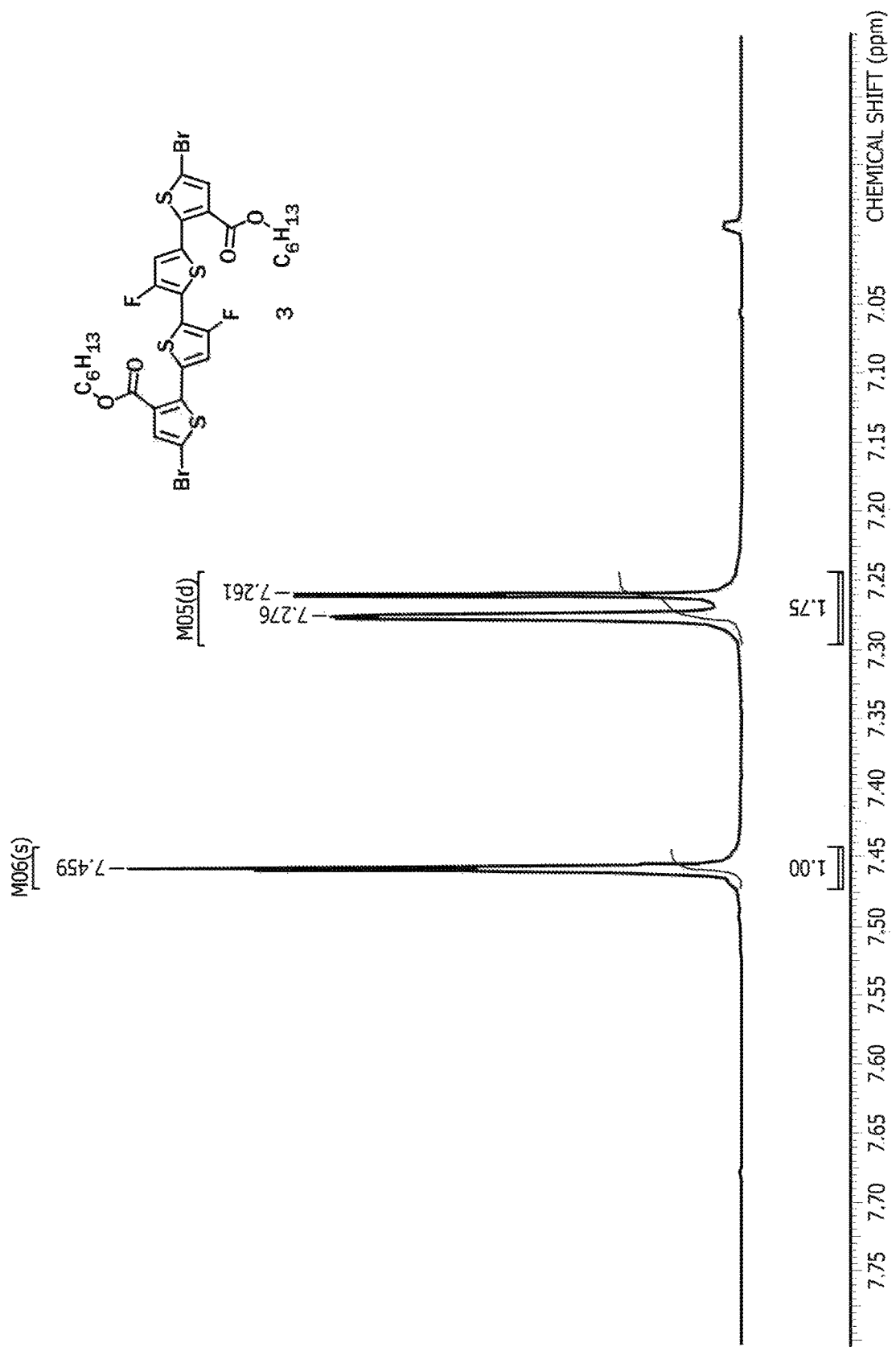
FIG. 12 depicts spectra of 5,5"'-dibromo-3",4'-difluoro-[2,2':5',2":5",2"'-quaterthiophene]-3,3"'-dicarboxylate.
Figure 13:
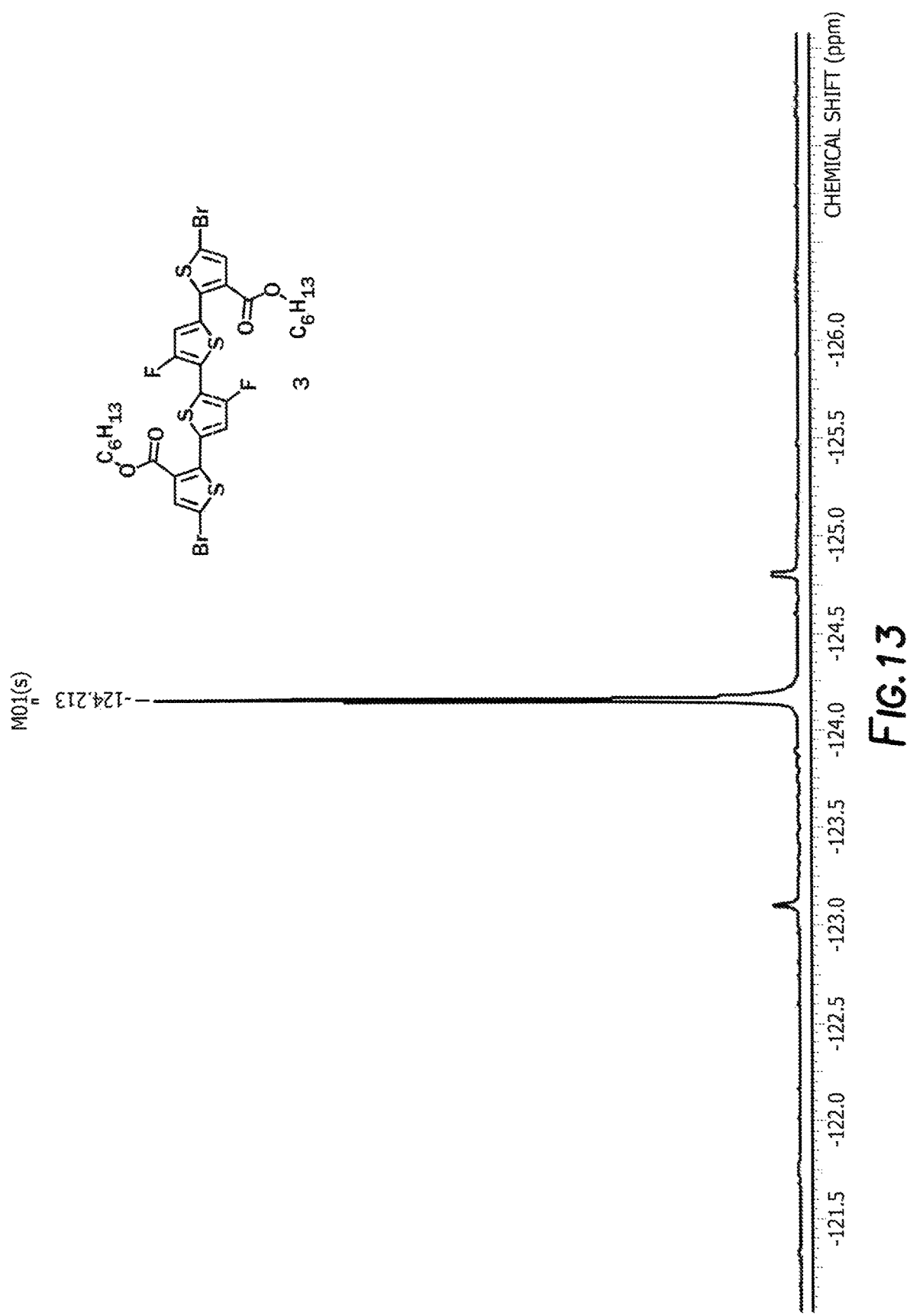
FIG. 13 depicts spectra of 5,5"'-dibromo-3",4'-difluoro-[2,2':5',2":5",2"'-quaterthiophene]-3,3"'-dicarboxylate.

Synthesis of intermediate compound 3 dihexyl 5,5"'-dibromo-3",4'-difluoro-[2,2':5',2":5",2"'-quaterthiophene]-3,3"'-dicarboxylate: Compound dihexyl 3",4'-difluoro-[2,2':5',2":5",2"'-quaterthiophene]-3,3"'-dicarboxylate (2.2 g, 0.004 mol) was added to a 250 mL Schlenk flask followed by 250 mL of anhydrous THF. The solution was cooled to 0° C. before N-bromosuccinimide (1.886 g, 0.011 mol) was added in portions. The reaction was stirred overnight. The reaction was stopped by adding saturated potassium carbonate solution. After the removal of solvent, the resulting mixture was subjected to column purification using a gradient from 0 to 50% dichloromethane in hexanes. Orange crystals (2.4 g, 59.6%) were obtained as the product after being the removal of solvent and dried in vacuo. FIG. 11 depicts $^1$H NMR spectrum of the aromatic region of compound dihexyl 5,5"'-dibromo-3",4'-difluoro-[2,2':5',2":5",2"'-quaterthiophene]-3,3"'-dicarboxylate in CDCl$_3$. FIG. 12 depicts $^1$H NMR spectrum of the aromatic region of compound dihexyl 5,5"'-dibromo-3",4'-difluoro-[2,2':5',2":5",2"'-quaterthiophene]-3,3"'-dicarboxylate in CDCl$_3$. FIG. 13 depicts $^{19}$F NMR spectrum of compound dihexyl 5,5"'-dibromo-3",4'-difluoro-[2,2':5',2":5",2"'-quaterthiophene]-3,3"'-dicarboxylate in CDCl$_3$.

Figure 14:
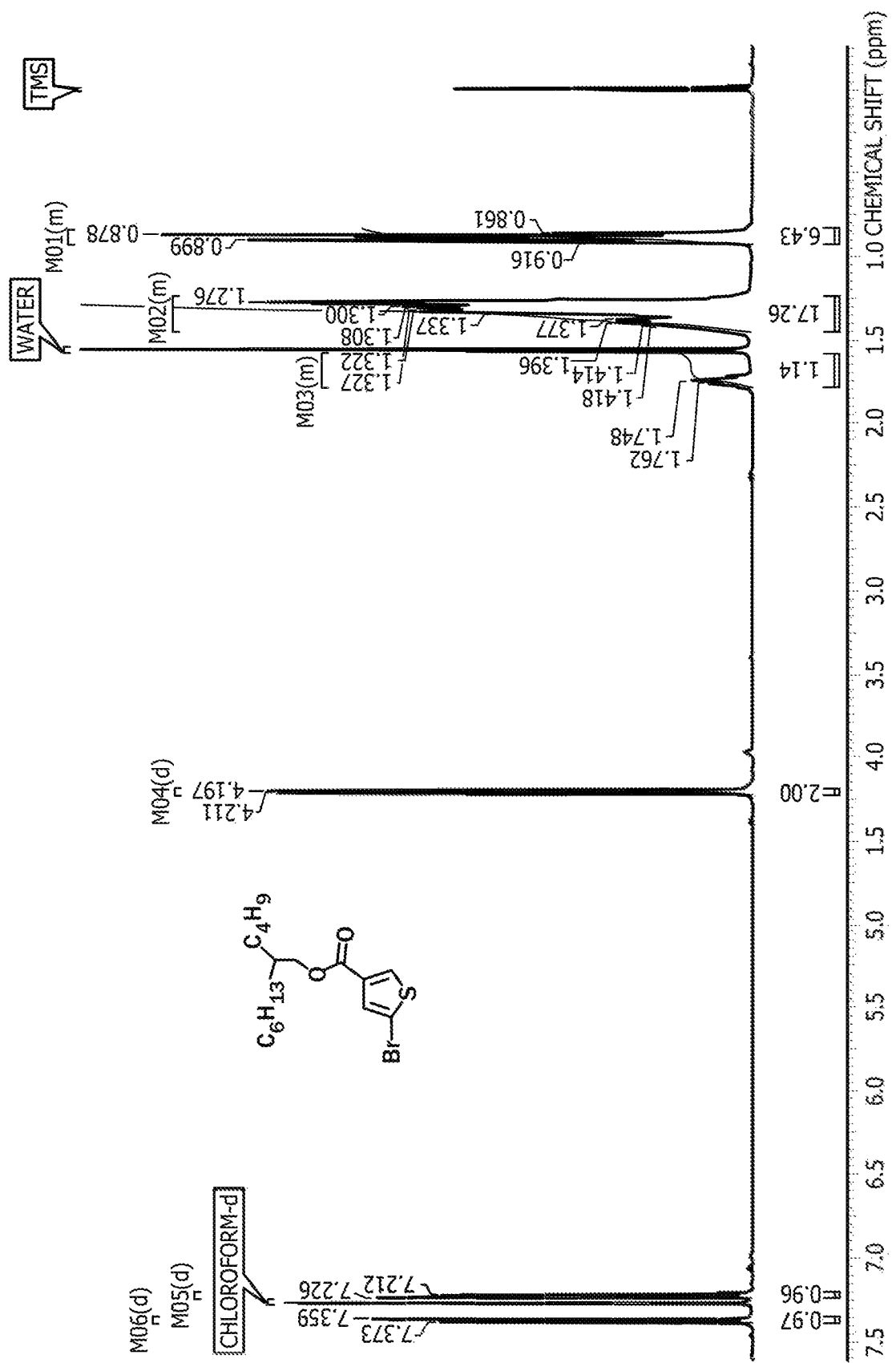
FIG. 14 depicts spectra of 2-butyloctyl 5-bromothiophene-3-carboxylate.
Figure 15:
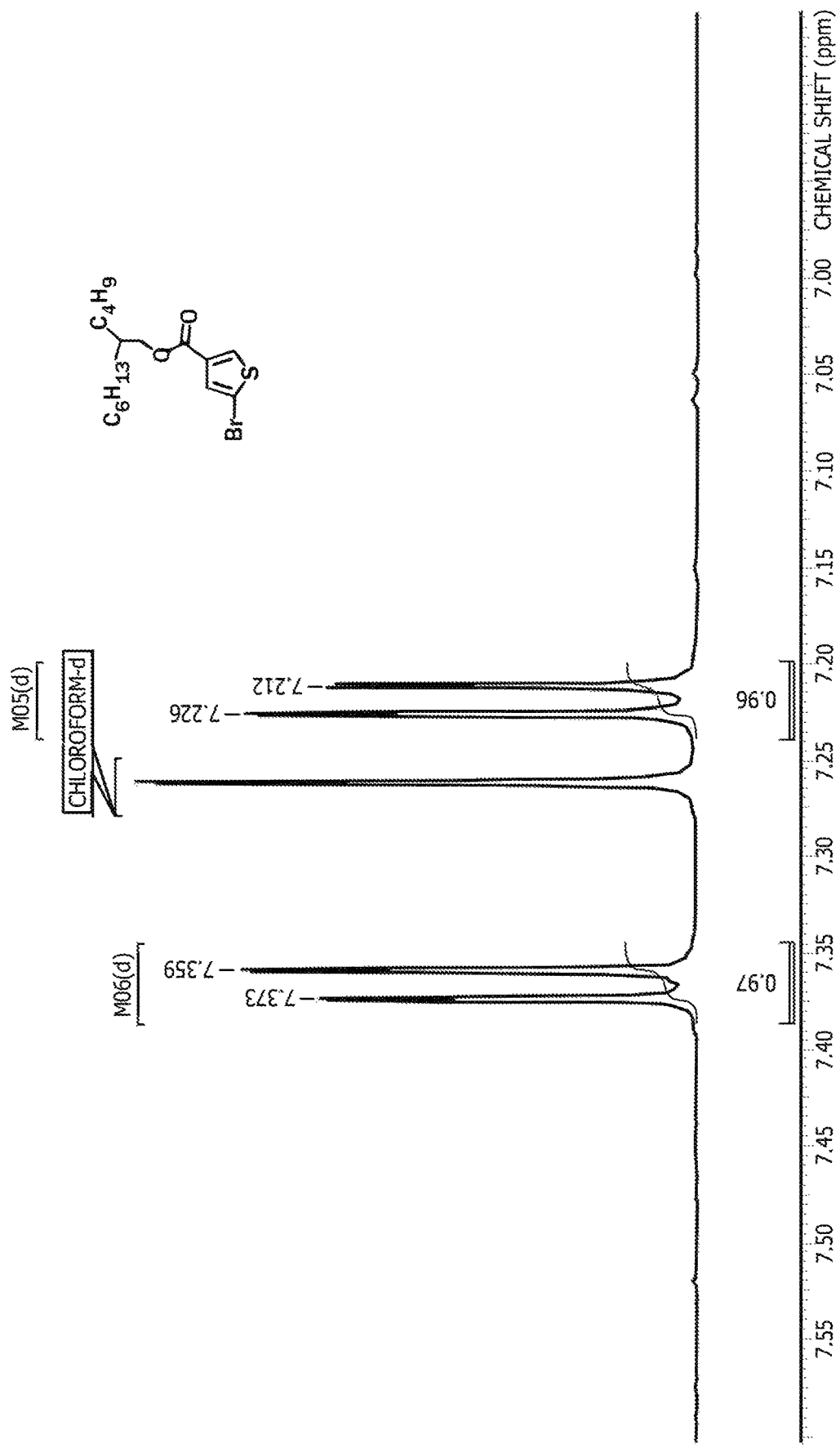
FIG. 15 depicts spectra of 2-butyloctyl 5-bromothiophene-3-carboxylate.
Figure 16:
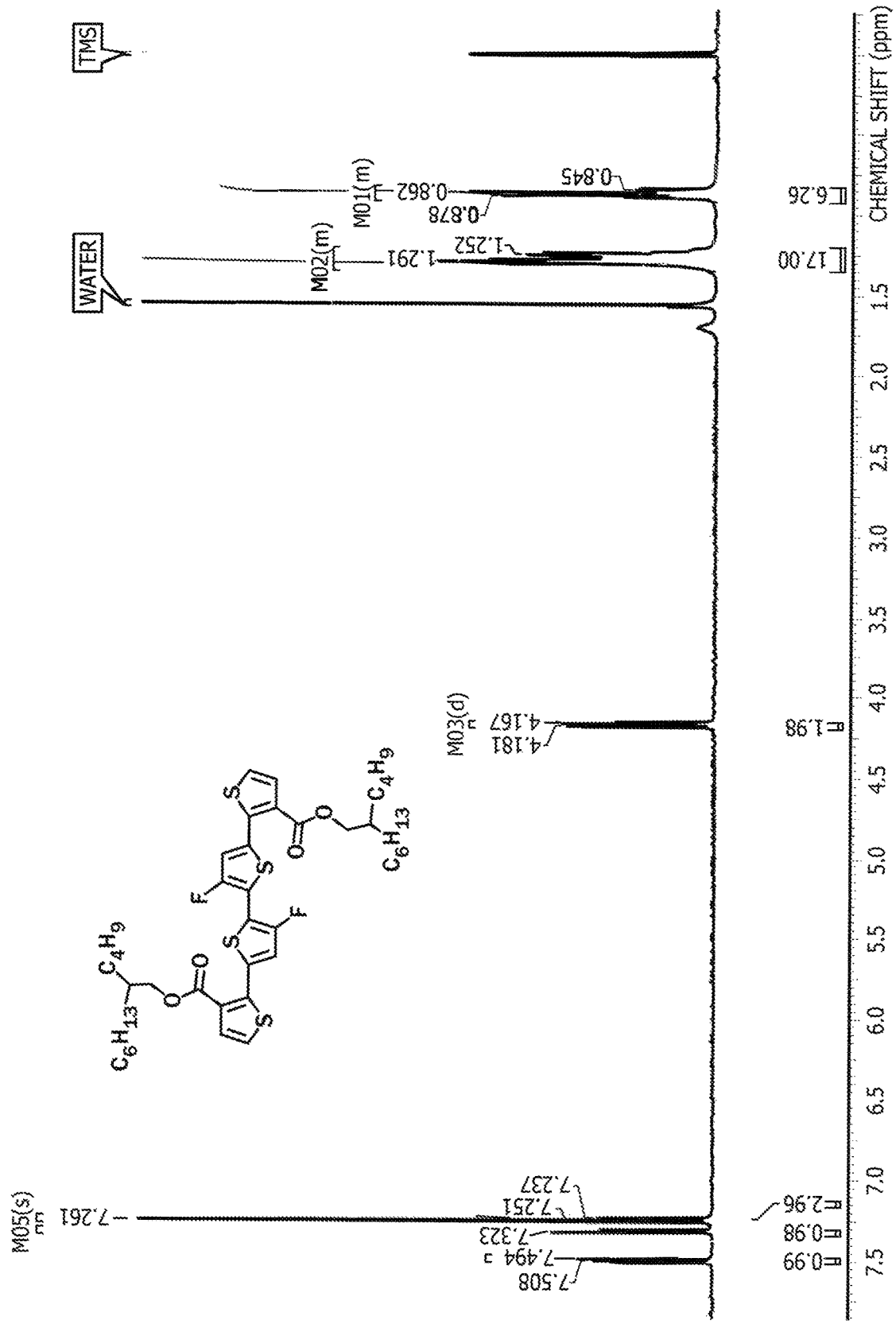
FIG. 16 depicts spectra of bis(2-butyloctyl) 3",4'-difluoro-[2,2':5',2":5",2"'-quaterthiophene ]-3,3"'-dicarboxylate.
Figure 17:
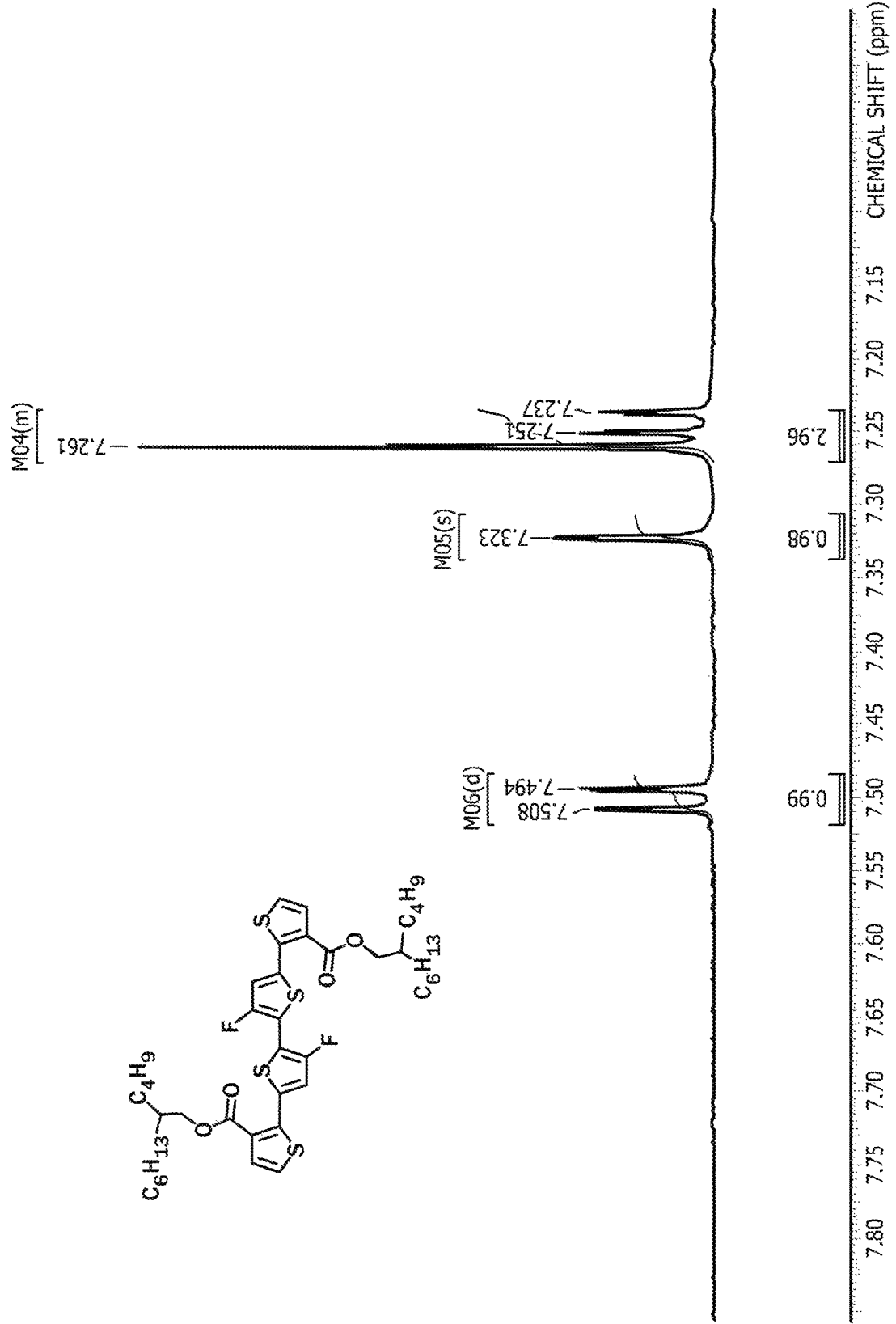
FIG. 17 depicts spectra of bis(2-butyloctyl) 3",4'-difluoro-[2,2':5',2":5",2"'-quaterthiophene ]-3,3"'-dicarboxylate.
Figure 18:
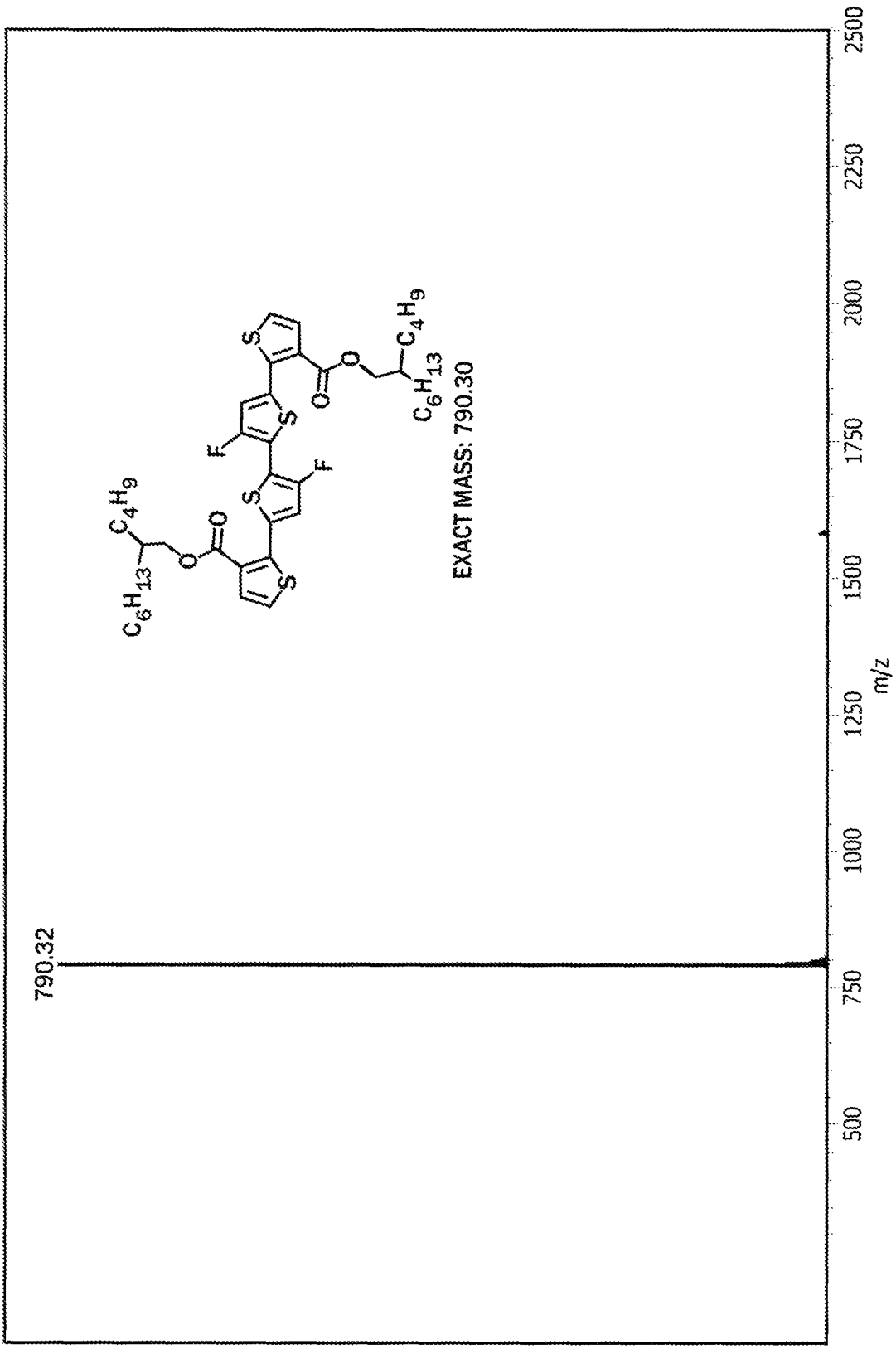
FIG. 18 depicts spectra of bis(2-butyloctyl) 3",4'-difluoro-[2,2':5',2":5",2"'-quaterthiophene ]-3,3"'-dicarboxylate.

Synthesis of intermediate compound 4 2-butyloctyl 5-bromothiophene-3-carboxylate: 2-bromothiophene-3-carboxylic acid (5.00 g, 0.024 mol), 2-butyloctanol (9.9 g, 0.053 mol), 4-dimethylaminopyridine (0.59 g, 0.005 mol), dicyclohexylcarbodiimide (DCC) (6.0 g, 0.029 mol) were combined in a 100 mL Schlenk flask. The system was degassed and backfilled with Argon three times before 60 mL of anhydrous dichloromethane was added. The mixture was stirred at room temperature overnight. The mixture was dry loaded into silica gel and purified by silica gel chromatography. Colorless liquid (6.81 g, yield, 75.6%) was obtained as product. FIG. 14 depicts $^1$H NMR spectrum of 2-butyloctyl 5-bromothiophene-3-carboxylate in CDCl$_3$. FIG. 15 depicts $^1$H NMR spectrum of the aromatic region of compound 2-butyloctyl 5-bromothiophene-3-carboxylate in CDCl$_3$ Synthesis of intermediate compound 4 bis(2-butyloctyl) 3",4'-difluoro-[2,2':5',2":5",2"'-quaterthiophene]-3,3"'-dicarboxylate: In a 100-mL Schlenk flask, compound 1 (3.1 g, 8.34 mmol), (3,3'-difluoro-[2,2'-bithiophene]-5,5'-diyl)bis (trimethylstannane) (2.0 g, 3.79 mmol), Pd$_2$dba$_3$ (69 mg, 0.076 mmol) and P(o-tol)$_3$ (92 mg, 0.30 mmol) were added. The mixture was degassed with argon twice before 25 mL of anhydrous toluene was added. The solution was heated at 105° C. for 24 hours. After removal of solvent, the crude product was purified by column chromatography on silica gel using a mixture of dichloromethane and hexane (3:1) as eluent to afford product (1.78 g, 59.4%) as an orange solid. FIG. 16 depicts $^1$H NMR spectrum of the aromatic region of compound bis(2-butyloctyl) 3",4'-difluoro-[2,2':5',2":5",2"'-quaterthiophene]-3,3"'-dicarboxylate in CDCl$_3$. FIG. 17 depicts $^1$H NMR spectrum of the aromatic region of compound bis(2-butyloctyl) 3",4'-difluoro-[2,2':5',2":5",2"'-quaterthiophene]-3,3"'-dicarboxylate in CDCl$_3$. FIG. 18 depicts FD-MS spectrum of the aromatic region of compound bis(2-butyloctyl) 3",4'-difluoro-[2,2':5',2":5",2"'-quaterthiophene]-3,3"'-dicarboxylate.

Figure 19:
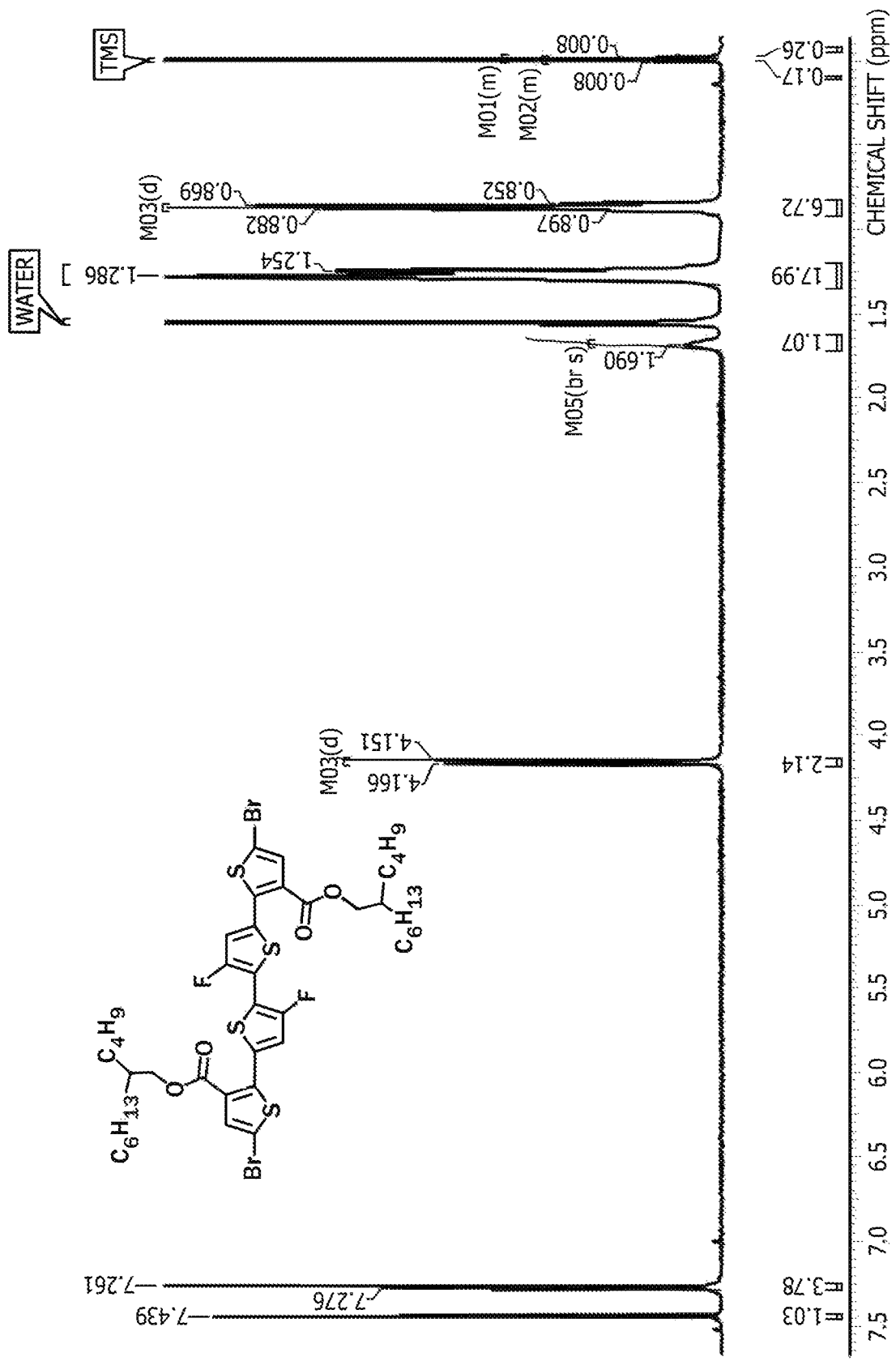
FIG. 19 depicts spectra of bis(2-butyloctyl) 5,5"'-dibromo-3",4'-difluoro-[2,2':5',2":5",2"'-quaterthiophene]-3,3"'-dicarboxylate.
Figure 20:
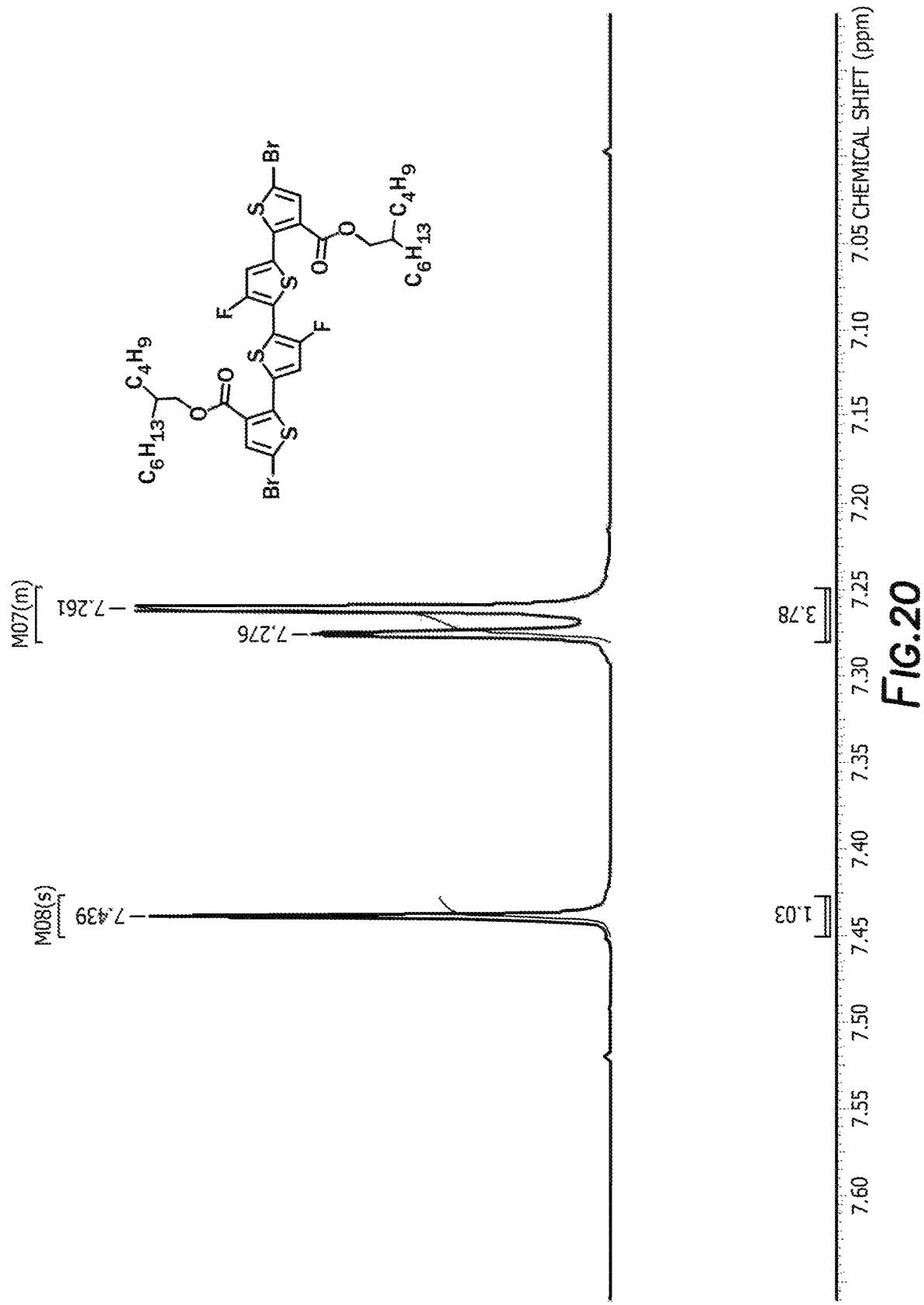
FIG. 20 depicts spectra of bis(2-butyloctyl) 5,5"'-dibromo-3",4'-difluoro-[2,2':5',2":5",2"'-quaterthiophene]-3,3"'-dicarboxylate.
Figure 21:
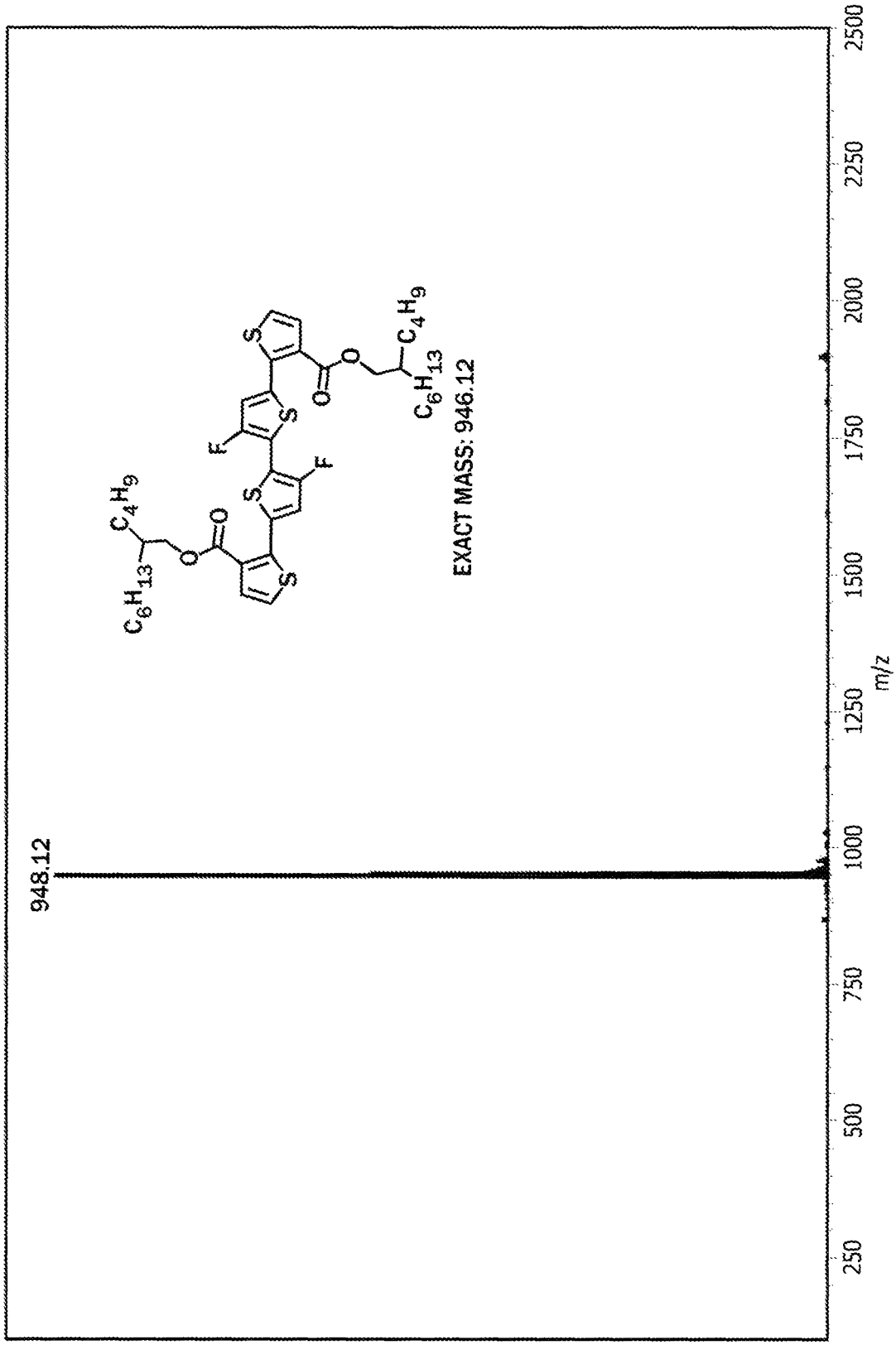
FIG. 21 depicts spectra of bis(2-butyloctyl) 5,5"'-dibromo-3",4'-difluoro-[2,2':5',2":5",2"'-quaterthiophene]-3,3"'-dicarboxylate.

Synthesis of intermediate compound 4 bis(2-butyloctyl) 5,5"-dibromo-3",4'-difluoro-[2,2':5',2":5",2"'-quaterthiophene]-3,3"'-dicarboxylate: Compound bis(2-butyloctyl) 3",4'-difluoro-[2,2':5',2":5",2"'-quaterthiophene]-3,3"'-dicarboxylate (1.78 g, 0.0023 mol) was added to a 250 mL Schlenk flask followed by 250 mL of anhydrous THF. The solution was cooled to 0° C. before N-bromosuccinimide (0.841 g, 0.0047 mol) was added in portions. The reaction was stirred overnight. The reaction was stopped by adding saturated potassium carbonate solution. After the removal of solvent, the resulting mixture was subjected to column purification using a gradient from 0 to 50% dichloromethane in hexanes. Orange crystals (2.05 g, 96.0%) were obtained as the product after being the removal of solvent and dried in vacuo. FIG. 19 depicts ¹H NMR spectrum of compound bis(2-butyloctyl) 5,5'''-dibromo-3'',4'-difluoro-[2,2':5',2'':5'',2''-quaterthiophene]-3,3'''-dicarboxylate in CDCl₃. FIG. 20 depicts ¹H NMR spectrum of the aromatic region of compound bis(2-butyloctyl) 5,5'''-dibromo-3'',4'-difluoro-[2,2':5',2'':5'',2''-quaterthiophene]-3,3'''-dicarboxylate in CDCl₃. FIG. 21 depicts FD-MS spectrum of the aromatic region of compound bis(2-butyloctyl) 5,5'''-dibromo-3'',4'-difluoro-[2,2':5',2'':5'',2''-quaterthiophene]-3,3'''-dicarboxylate.

Synthesis of compound 2-hexyldecyl 5-bromothiophene-3-carboxylate: 2-bromothiophene-3-carboxylic acid (5.0 g, 0.024 mol), 2-butyloctanol (13.7 g, 0.053 mol), 4-dimethylaminopyridine (0.59 g, 0.005 mol), dicyclohexylcarbodiimide (DCC) (5.98 g, 0.029 mol) were combined in a 500 mL Schlenk flask. The system was degassed and backfilled with Argon three times before 200 mL of anhydrous dichloromethane was added. The mixture was stirred at room temperature overnight. The mixture was dry loaded into silica gel and purified by silica gel chromatography. Colorless liquid (9.7 g, yield, 93.1%) was obtained as product.

Synthesis of compound bis(2-hexyldecyl) 3'',4'-difluoro-[2,2':5',2'':5'',2'''-quaterthiophene]-3,3'''-dicarboxylate:

In a 100-mL Schlenk flask, compound 2-hexyldecyl 2-bromothiophene-3-carboxylate (3.76 g, 8.7 mmol), (3,3'-difluoro-[2,2'-bithiophene]-5,5'-diyl)bis(trimethylstannane) (2.0 g, 3.8 mmol), Pd(PPh₃)₄ (69 mg, 0.076 mmol) were added. The mixture was degassed with argon twice before 50 mL of anhydrous toluene was added. The solution was heated at 105° C. for 24 hours. After removal of solvent, the crude product was purified by column chromatography on silica gel using a mixture of dichloromethane and hexane (3:1) as eluent to afford compound 2 (2.84 g, 82.9%) as an orange solid.

Synthesis of compound bis(2-hexyldecyl) 5,5'''-dibromo-3'',4'-difluoro-[2,2':5',2'':5'',2''-quaterthiophene]-3,3'''-dicarboxylate: Compound bis(2-hexyldecyl) 3'',4'-difluoro-[2,2':5',2'':5'',2''-quaterthiophene]-3,3'''-dicarboxylate (2.84 g, 0.0031 mol) was added to a 250 mL Schlenk flask followed by 250 mL of anhydrous THF. N-bromosuccinimide (2.04 g, 0.0113 mol) was added in portions at room temperature. The reaction was stirred overnight. The reaction was stopped by adding saturated potassium carbonate solution. After the removal of solvent, the resulting mixture was subjected to column purification using a gradient from 0 to 50% dichloromethane in hexanes. Orange crystals (2.50 g, 74.9%) were obtained as the product after being the removal of solvent and dried in vacuo.

Polymer Synthesis

Figure 22:
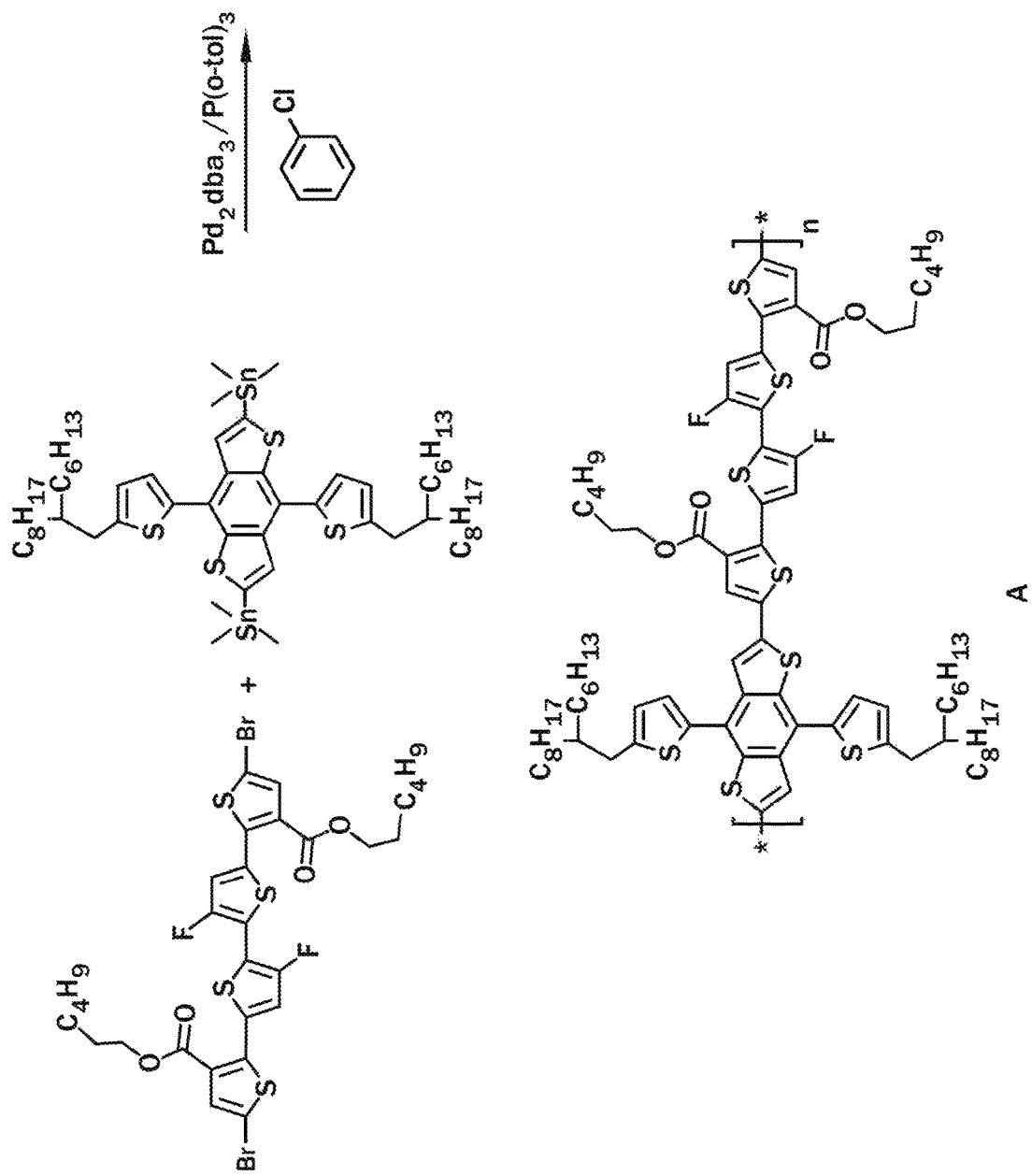
FIG. 22 depicts a reaction mechanism.

Synthesis of Polymer A as depicted in FIG. 22: In a 25-mL Schlenk flask, compound 3 (132.8 mg, 0.170 mmol), (4,8-bis(5-(2-ethylhexyl)thiophen-2-yl)benzo[1,2-b:4,5-b']dithiophene-2,6-diyl)bis(trimethylstannane) (200 mg, 0.177 mmol), Pd₂dba₃ (3.2 mg, 0.004 mmol) and P(o-tol)₃ (4.3 mg, 0.014 mmol) were added. The mixture was degassed under vacuum and backfilled with argon three times before 1.6 mL of anhydrous chlorobenzene was added. The solution was heated at 130° C. for 18 hours. The mixture was poured into methanol after cooling to room temperature. The solid was filtered and purified by Soxhlet extraction with acetone (14 hours), hexane (8 hours), dichloromethane (16 hours) and chloroform (24 hours). The chloroform portion contained the main product (230 mg, 89.7%) and was reprecipitated by methanol and dried overnight.

Figure 23:
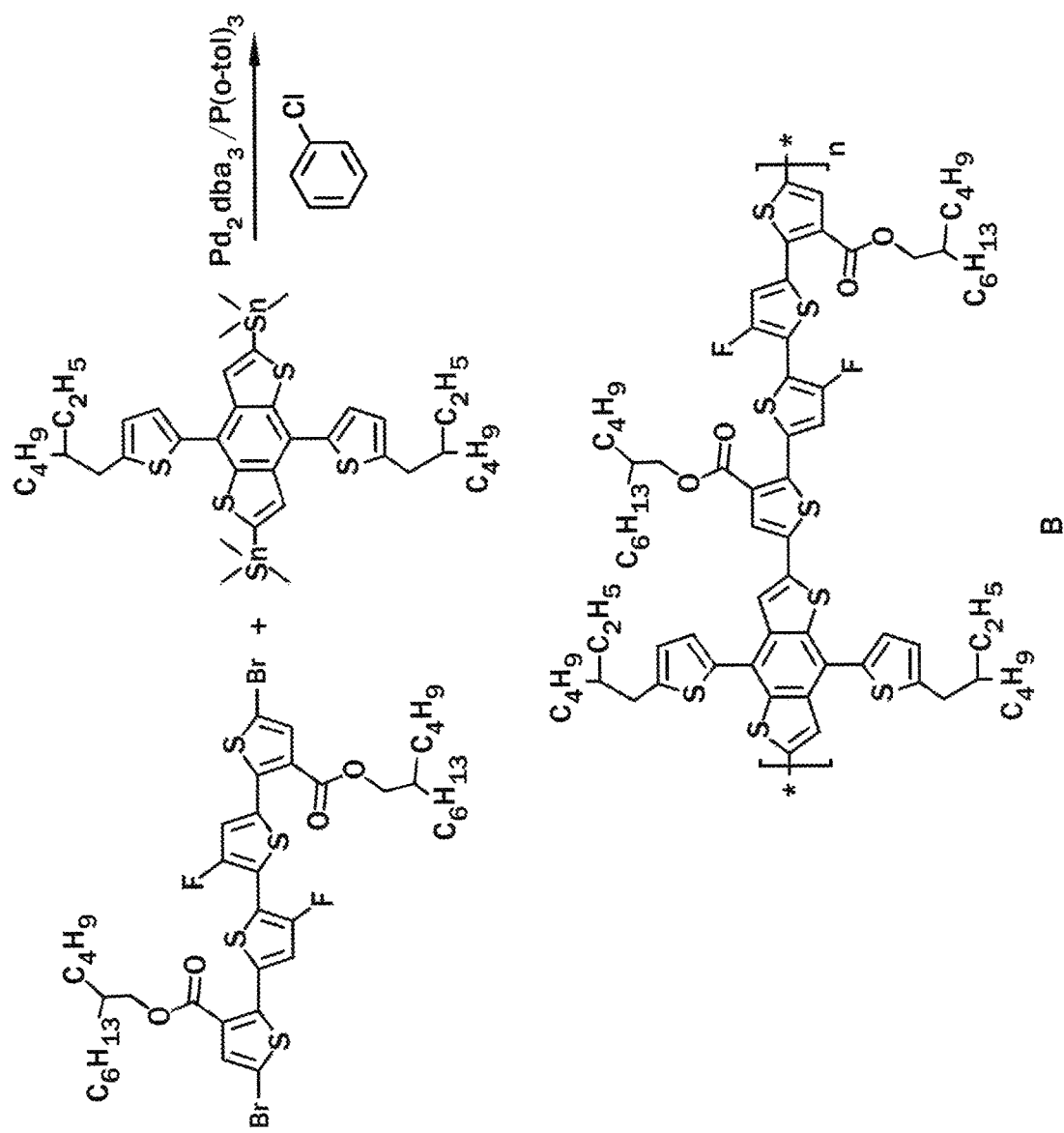
FIG. 23 depicts a reaction mechanism.

Synthesis of Polymer B as depicted in FIG. 23: In a 25-mL Schlenk flask, compounds bis(2-butyloctyl) 5,5'''-dibromo-3'',4'-difluoro-[2,2':5',2'':5'',2''-quaterthiophene]-3,3'''-dicarboxylate (200 mg, 0.211 mmol), (4,8-bis(5-(2-ethylhexyl)thiophen-2-yl)benzo[1,2-b:4,5-b']dithiophene-2,6-diyl)bis(trimethylstannane) (200 mg, 0.221 mmol), Pd₂dba₃ (3.9 mg, 0.004 mmol) and P(o-tol)₃ (5.1 mg, 0.017 mmol) were added. The mixture was degassed under vacuum and backfilled with argon three times before 2.1 mL of anhydrous chlorobenzene was added. The solution was heated at 130° C. for 20 hours. The mixture was poured into methanol after cooling to room temperature. The solid was filtered and purified by Soxhlet extraction with acetone (16 hours), hexane (4 hours), dichloromethane (16 hours) and chlorobenzene (3 hours). The chlorobenzene portion contained the main product (231 mg, 79.3%) and was reprecipitated by methanol and dried overnight.

Figure 24:
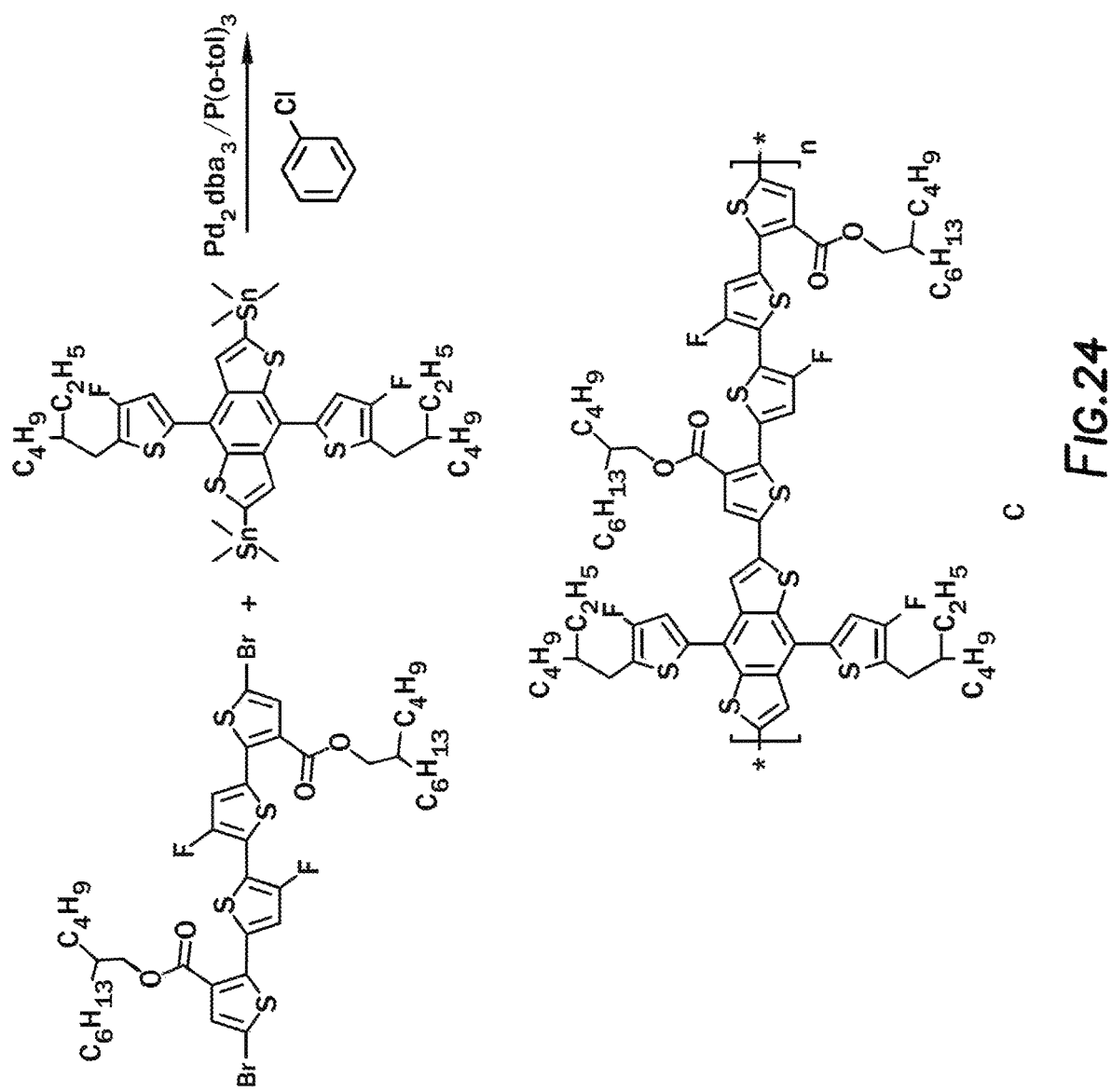
FIG. 24 depicts a reaction mechanism.

Synthesis of Polymer C as depicted in FIG. 24: In a 25-mL Schlenk flask, compounds bis(2-butyloctyl) 5,5'''-dibromo-3'',4'-difluoro-[2,2':5',2'':5'',2''-quaterthiophene]-3,3'''-dicarboxylate (200 mg, 0.211 mmol), (4,8-bis(5-(2-ethylhexyl)-4-fluorothiophen-2-yl)benzo[1,2-b:4,5-b']dithiophene-2,6-diyl)bis(trimethylstannane) (208 mg, 0.221 mmol), Pd₂dba₃ (3.9 mg, 0.004 mmol) and P(o-tol)₃ (5.1 mg, 0.017 mmol) were added. The mixture was degassed under vacuum and backfilled with argon three times before 2.1 mL of anhydrous chlorobenzene was added. The solution was heated at 130° C. for 20 hours. The mixture was poured into methanol after cooling to room temperature. The solid was filtered and purified by Soxhlet extraction with acetone (16 hours), hexane (4 hours), dichloromethane (16 hours) and chlorobenzene (7 hours). The chlorobenzene portion contained the main product (271 mg, 91.6%) and was reprecipitated by methanol and dried overnight.

Figure 25:
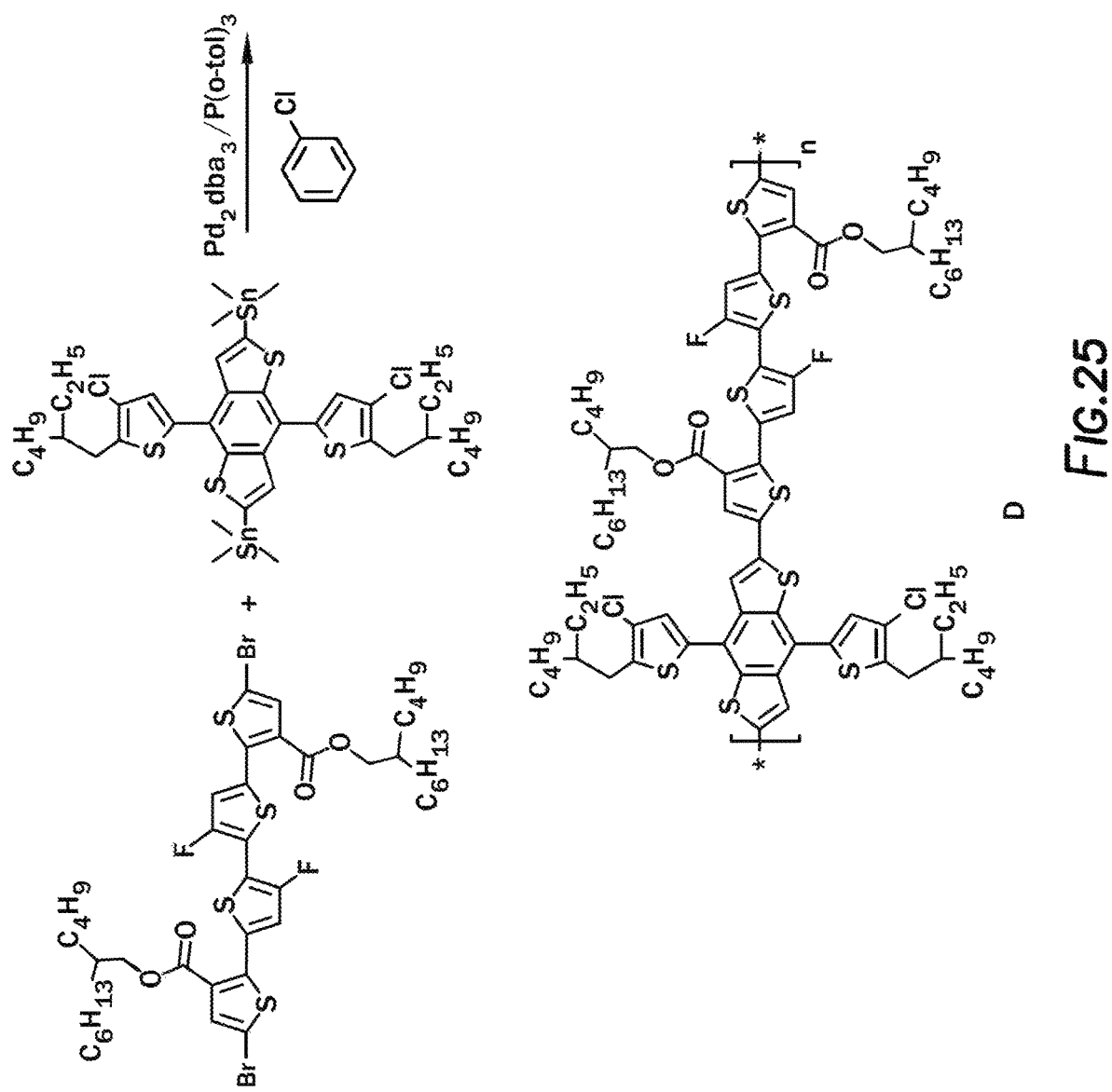
FIG. 25 depicts a reaction mechanism.

Synthesis of Polymer D as depicted in FIG. 25: In a 25-mL Schlenk flask, compounds bis(2-butyloctyl) 5,5'''-dibromo-3'',4'-difluoro-[2,2':5',2'':5'',2''-quaterthiophene]-3,3'''-dicarboxylate (100 mg, 0.105 mmol), (4,8-bis(4-chloro-5-(2-ethylhexyl)thiophen-2-yl)benzo[1,2-b:4,5-b']dithiophene-2,6-diyl)bis(trimethylstannane) (107 mg, 0.111 mmol), Pd₂dba₃ (1.9 mg, 0.002 mmol) and P(o-tol)₃ (2.6 mg, 0.008 mmol) were added. The mixture was degassed under vacuum and backfilled with argon three times before 1.2 mL of anhydrous chlorobenzene was added. The solution was heated at 130° C. for 20 hours. The mixture was poured into methanol after cooling to room temperature. The solid was filtered and purified by Soxhlet extraction with acetone (16 hours), hexane (4 hours), dichloromethane (16 hours) and chlorobenzene (3 hours). The chlorobenzene portion contained the main product (113 mg, 74.6%) and was reprecipitated by methanol and dried overnight.

Figure 26:
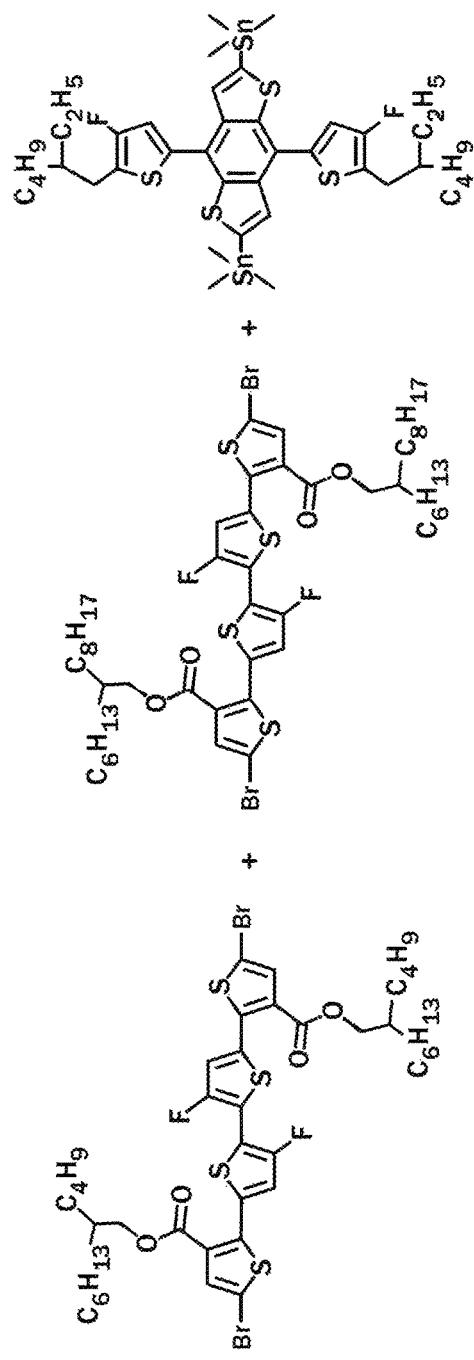
FIG. 26 depicts a reaction mechanism.
Figure 26:
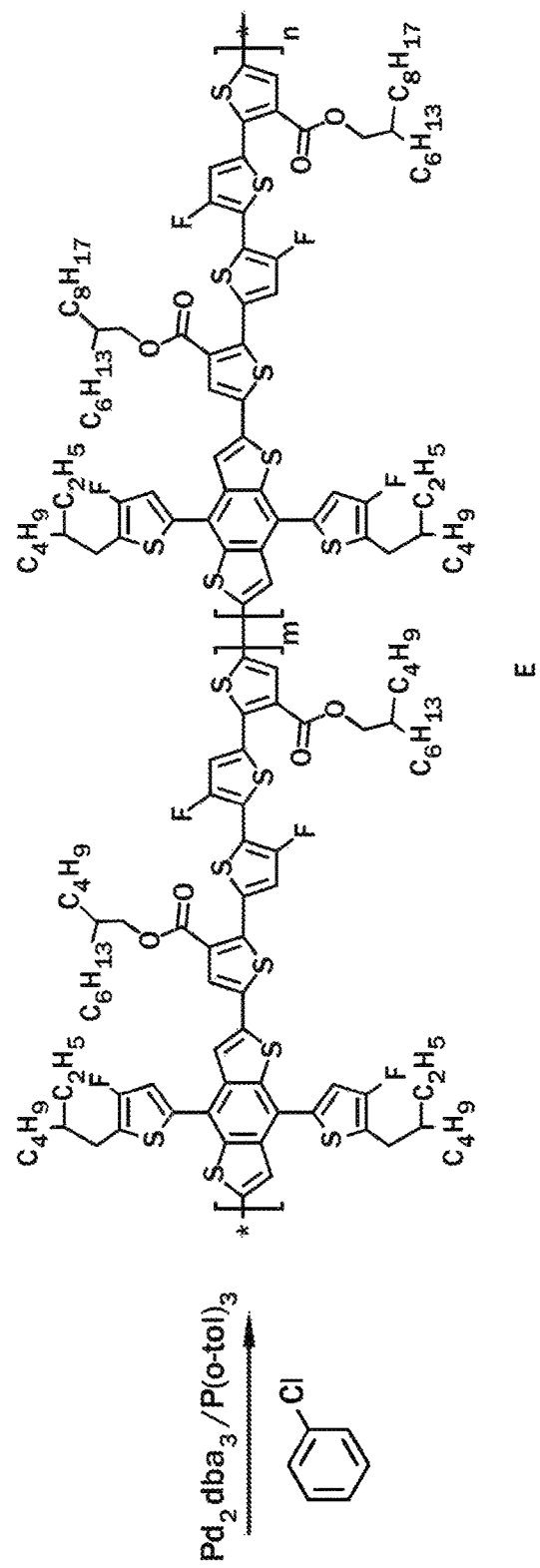

Synthesis of Polymer E as depicted in FIG. 26: In a 25-mL Schlenk flask, compounds bis(2-butyloctyl) 5,5'''-dibromo-3'',4'-difluoro-[2,2':5',2'':5'',2''-quaterthiophene]-3,3'''-dicarboxylate (265 mg, 0.279 mmol), bis(2-2-hexyldecyl) 5,5'''-dibromo-3'',4'-difluoro-[2,2':5',2'':5'',2''-quaterthiophene]-3,3'''-dicarboxylate (127.0 mg, 0.120 mmol), (4,8-bis(5-(2-ethylhexyl)-4-fluorothiophen-2-yl)benzo[1,2-b:4,5-b']dithiophene-2,6-diyl)bis(trimethylstannane) (394.0 mg, 0.419 mmol), Pd₂dba₃ (7.3 mg, 0.008 mmol) and P(o-tol)₃ (9.7 mg, 0.032 mmol) were added. The mixture was degassed under vacuum and backfilled with argon three times before 4.1 mL of anhydrous chlorobenzene was added. The solution was heated at 135° C. for 19 hours. The mixture was poured into methanol after cooling to room temperature. The solid was filtered and purified by Soxhlet extraction with acetone (16 hours), hexane (4 hours), dichloromethane (3 hours). The chlorobenzene portion contained the main product (555 mg, 92.2%) and was reprecipitated by methanol and dried overnight.

Figure 27:
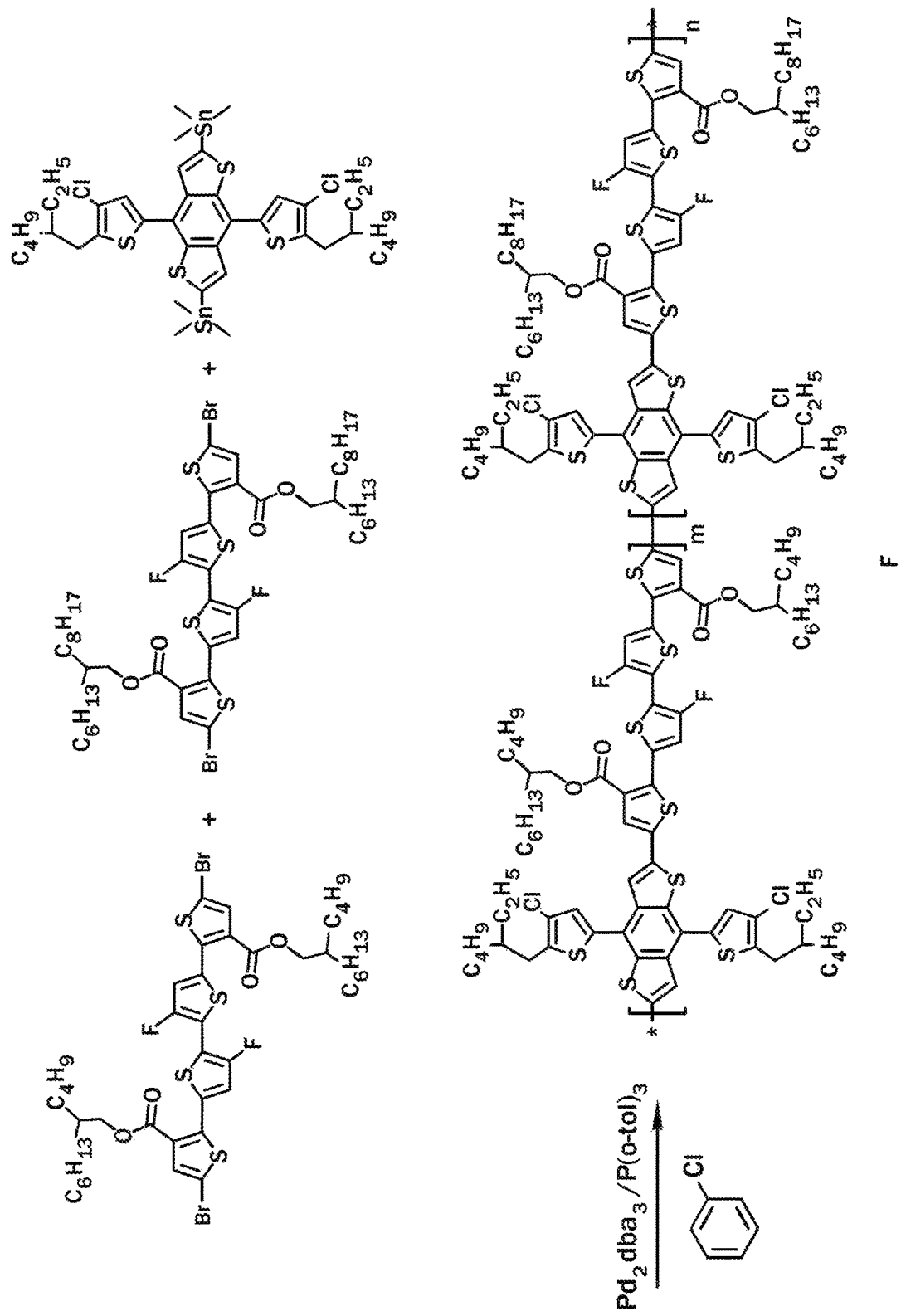
FIG. 27 depicts a reaction mechanism.

Synthesis of Polymer F as depicted in FIG. 27: In a 25-mL Schlenk flask, compounds bis(2-butyloctyl) 5,5'''-dibromo-3'',4'-difluoro-[2,2':5',2'':5'',2'''-quaterthiophene]-3,3'''-dicarboxylate (265 mg, 0.279 mmol), bis(2-hexyldecyl) 5,5'''-dibromo-3'',4'-difluoro-[2,2':5',2'':5'',2'''-quaterthiophene]-3,3'''-dicarboxylate (127.0 mg, 0.120 mmol), (4,8-bis(5-(2-ethylhexyl)-4-fluorothiophen-2-yl)benzo[1,2-b:4,5-b']dithiophene-2,6-diyl)bis(trimethylstannane) (407.8 mg, 0.419 mmol), Pd$_2$dba$_3$ (7.3 mg, 0.008 mmol) and P(o-tol)$_3$ (9.7 mg, 0.032 mmol) were added. The mixture was degassed under vacuum and backfilled with argon three times before 4.1 mL of anhydrous chlorobenzene was added. The solution was heated at 130° C. for 20 hours. The mixture was poured into methanol after cooling to room temperature. The solid was filtered and purified by Soxhlet extraction with acetone (16 hours), hexane (4 hours), dichloromethane (3 hours). The chlorobenzene portion contained the main product (555 mg, 90.2%) and was reprecipitated by methanol and dried overnight.

In one embodiment, the polymer can comprise:

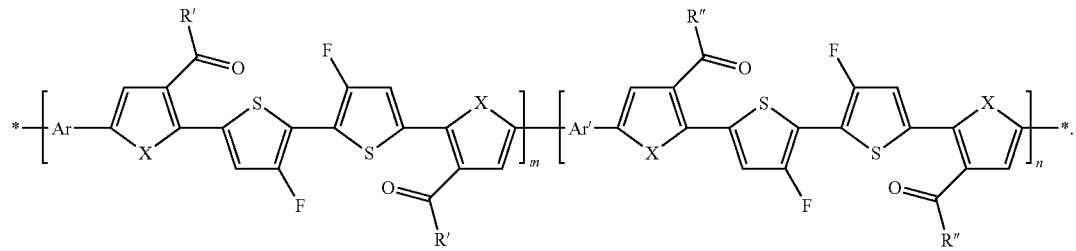

In this embodiment, R' and R'', can be independently selected from the group consisting of: a halogen, a substituted alkyl, an unsubstituted alkyl, a substituted aryl, and an unsubstituted aryl. Additionally, X$_1$ and X$_2$ can be independently selected from the group consisting of: O, S, Se, N—R, and Si—R—R. Lastly, Ar and Ar' can be identical or different and can be independently selected from the group consisting of: a substituted aryl, and an unsubstituted aryl. In one example Ar and Ar' can be independently selected from the group consisting of:

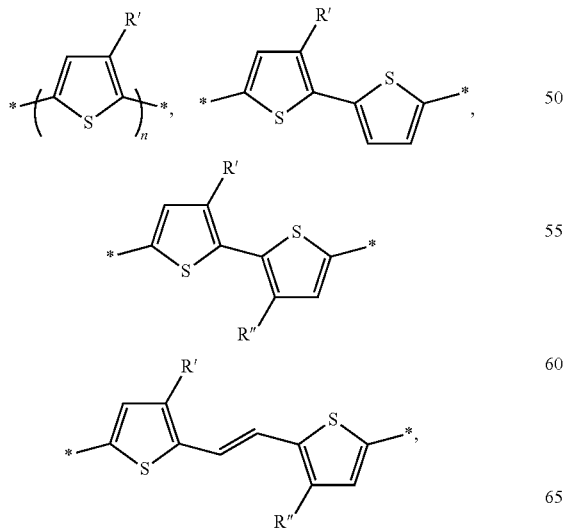

-continued

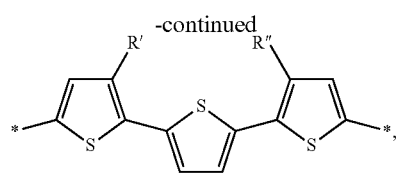

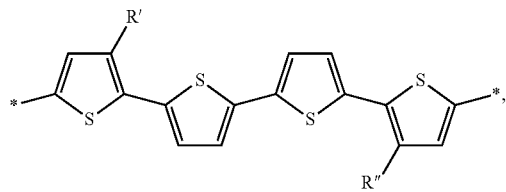

-continued

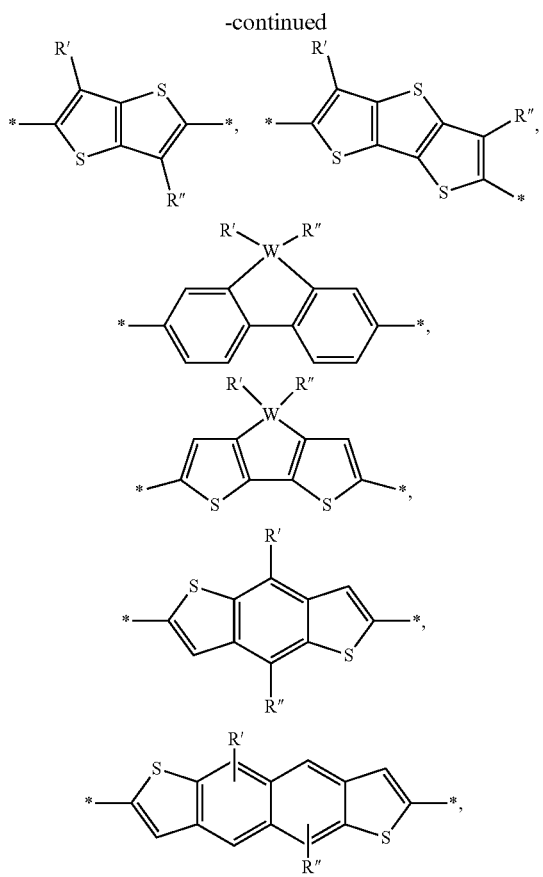

-continued
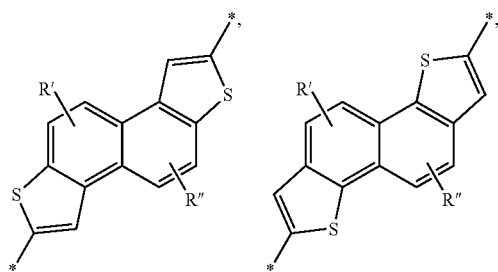
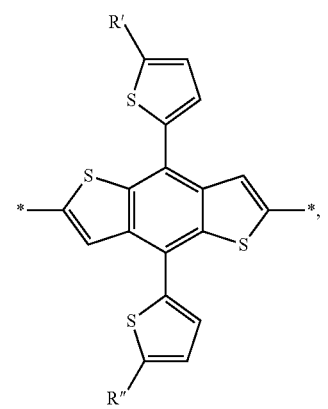
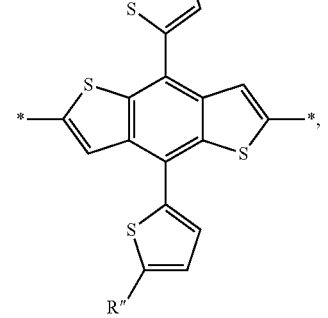
-continued
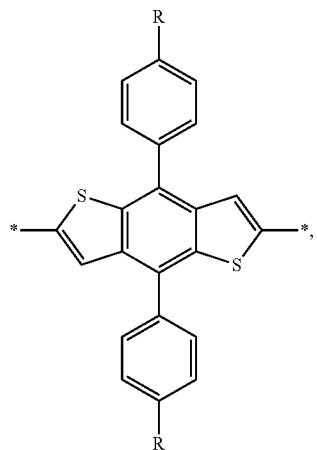
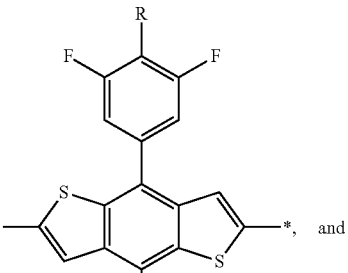
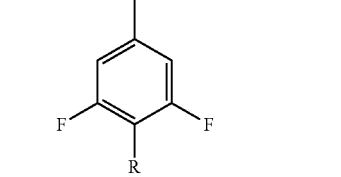
and
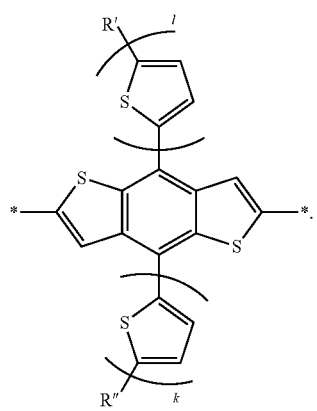
In another example, Ar and Ar' can be independently selected from the group consisting of:
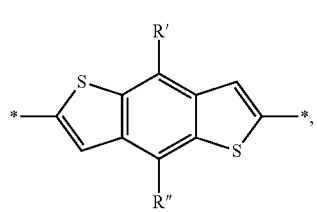

-continued

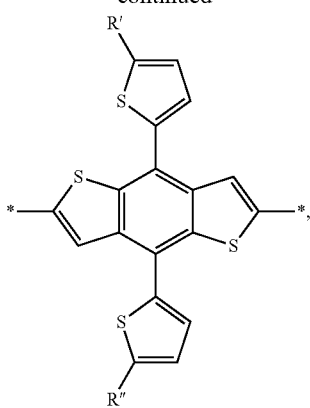

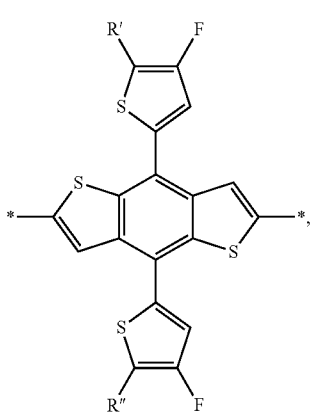

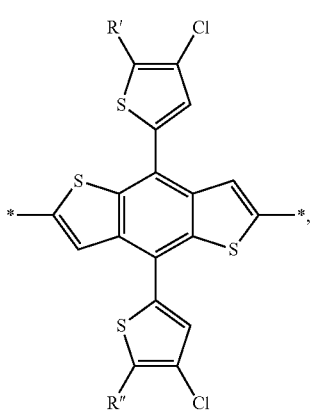

-continued

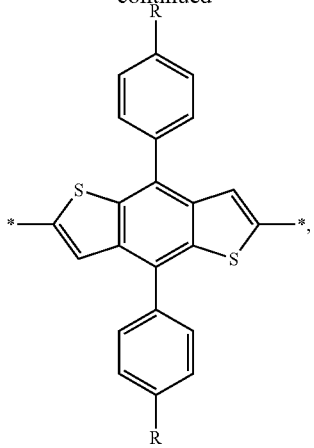

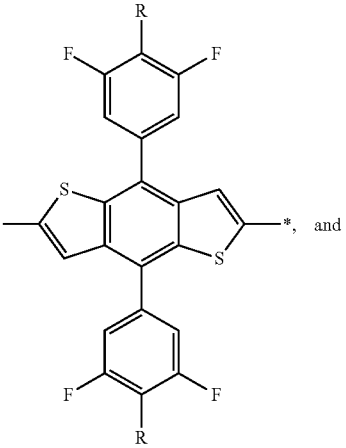, and

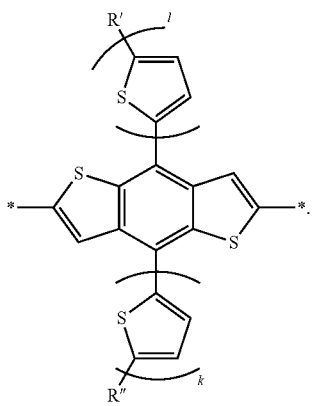.

In all of these embodiments R, R' and R" can all be independently selected from the group consisting of: a halogen, a substituted alkyl, an unsubstituted alkyl, a substituted aryl, an unsubstituted aryl, a substituted heteroaryl and an unsubstituted heteroaryl. Additionally, in these embodiments, W can be independently selected from the group consisting of: C, S, Si, and Se.

In yet another example polymer F can comprise:

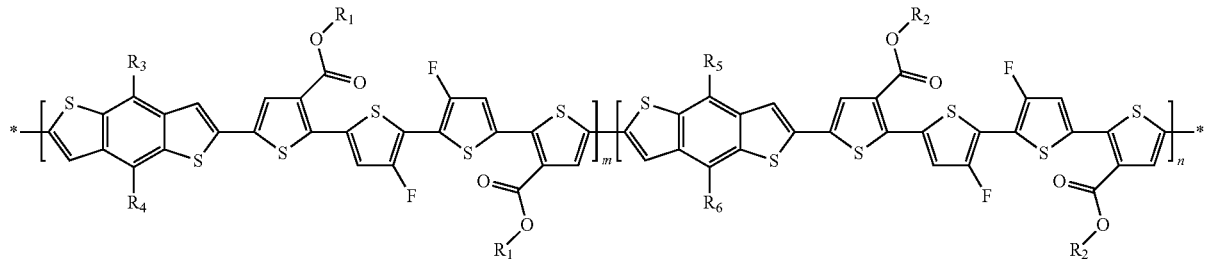

In this embodiment, the ratio of m is between 0.6 to 0.8 and n is between 0.2 and 0.4. Additionally, in this embodiment, $R_1$, $R_2$, $R_3$, $R_4$, $R_5$ and $R_6$ are independently selected from the group consisting of: a halogen, a substituted alkyl, an unsubstituted alkyl, a substituted aryl, an unsubstituted aryl, a substituted heteroaryl and an unsubstituted heteroaryl.

In another embodiment, $R_3$ $R_4$, $R_5$, $R_6$ can be independently selected from

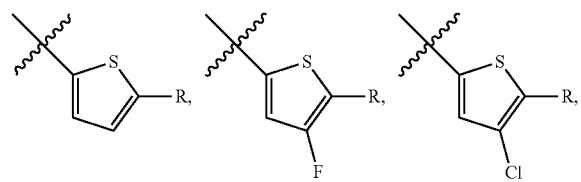

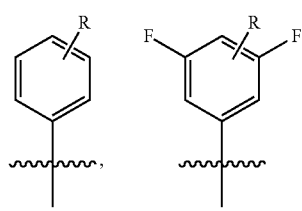

wherein R is independently selected from the group consisting of: a halogen, a substituted alkyl, an unsubstituted alkyl, a substituted aryl, an unsubstituted aryl, a substituted heteroaryl and an unsubstituted heteroaryl.

Anode

When used in as an organic photovoltaic device the polymer can be used in conjunction with an anode. The anode for the organic photovoltaic device can be any conventionally known anode capable of operating as an organic photovoltaic device. Examples of anodes that can be used include: indium tin oxide, aluminum, silver, carbon, graphite, graphene, PEDOT:PSS, copper, metal nanowires, $Zn_{99}InO_x$, $Zn_{98}In_2O_x$, $Zn_{97}In_3O_x$, $Zn_{95}Mg_5O_x$, $Zn_{90}Mg_{10}O_x$, and $Zn_{85}Mg_{15}O_x$.

Cathode

When used in as an organic photovoltaic device the polymer can be used in conjunction with a cathode. The cathode for the organic photovoltaic device can be any conventionally known cathode capable of operating as an organic photovoltaic device. Examples of cathodes that can be used include: indium tin oxide, carbon, graphite, graphene, PEDOT:PSS, copper, silver, aluminum, gold, metal nanowires.

Electron Transport Layer

When used in as an organic photovoltaic device the copolymer can be deposited onto an electron transport layer. Any commercially available electron transport layer can be used that is optimized for organic photovoltaic devices. In one embodiment the electron transport layer can comprise $(AO_x)_y BO_{(1-y)}$. In this embodiment, $(AO_x)_y$ and $BO_{(1-y)}$ are metal oxides. A and B can be different metals selected to achieve ideal electron transport layers. In one embodiment A can be aluminum, indium, zinc, tin, copper, nickel, cobalt, iron, ruthenium, rhodium, osmium, tungsten, magnesium, indium, vanadium, titanium and molybdenum.

In one embodiment B can be aluminum, indium, zinc, tin, copper, nickel, cobalt, iron, ruthenium, rhodium, osmium, tungsten, vanadium, titanium and molybdenum.

Examples of $(AO_x)_y BO_{(1-y)}$ include: $(SnO_x)_y ZnO_{(1-y)}$, $(AlO_x)_y ZnO_{(1-y)}$, $(AlO_x)_y InO_{z(1-y)}$, $(AlO_x)_y SnO_{z(1-y)}$, $(AlO_x)_y CuO_{z(1-y)}$, $(AlO_x)_y WO_{z(1-y)}$, $(InO_x)_y ZnO_{(1-y)}$, $(InO_x)_y SnO_{z(1-y)}$, $(InO_x)_y NiO_{z(1-y)}$, $(ZnO_x)_y CuO_{z(1-y)}$, $(ZnO_x)_y NiO_{z(1-y)}$, $(ZnO_x)_y FeO_{z(1-y)}$, $(WO_x)_y VO_{z(1-y)}$, $(WO_x)_y TiO_{z(1-y)}$, and $(WO_x)_y MoO_{z(1-y)}$.

In an alternate embodiment, various fullerene dopants can be combined with $(AO_x)_y BO_{(1-y)}$ to make an electron transport layer for the organic photovoltaic device. Examples of fullerene dopants that can be combined include

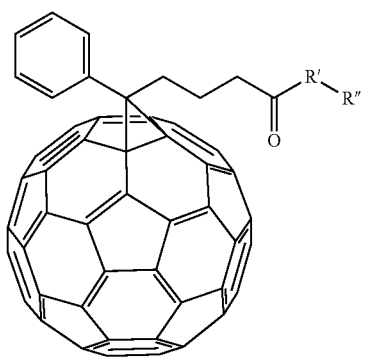

and [6,6]-phenyl-$C_{60}$-butyric-N-2-trimethylammonium ethyl ester iodide.

In the embodiment of

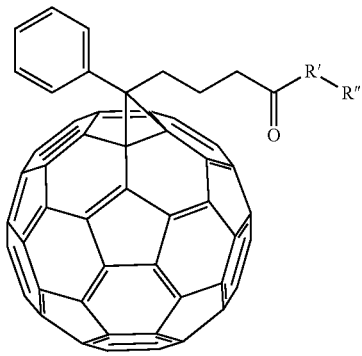

R' can be selected from either N, O, S, C, or B. In other embodiment R" can be alkyl chains or substituted alkyl chains. Examples of substitutions for the substituted alkyl chains include halogens, N, Br, O, Si, or S. In one example R" can be selected from

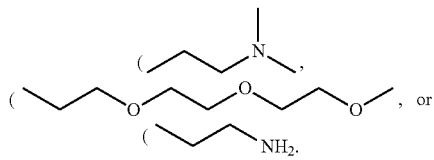

Other examples of fullerene dopants that can be used include: [6,6]-phenyl-$C_{60}$-butyric-N-(2-aminoethyl)acetamide, [6,6]-phenyl-$C_{60}$-butyric-N-triethyleneglycol ester and [6,6]-phenyl-$C_{60}$-butyric-N-2-dimethylaminoethyl ester.

Organic Photovoltaic Device Fabrication

Zinc/tin oxide (ZTO):phenyl-C60-butyric-N-(2-hydroxyethyl)acetamide (PCBNOH) sol-gel solution was prepared by dissolving zinc acetate dihydrate or tin(II) acetate in 2-methoxyethanol and ethanolamine. Specifically, the ZTO:PCBNOH sol-gel electron transport layer solution was prepared by mixing Zn(OAc)$_2$ (3.98 g), Sn(OAc)$_2$ (398 mg) and PCBNOH (20.0 mg) in 2-methoxyethanol (54 mL) with ethanolamine (996 μL). Solutions were then further diluted to 65 vol % by adding more 2-methoxyethanol and stirred for at least an hour before spin casting onto indium tin oxide substrate to form the electron transport layer.

In alternate embodiments, the formation of ZTO ([6,6]-phenyl-$C_{60}$-butyric-N-2-trimethylammonium ethyl ester iodide (PCBNMI) can be used as well. One method of forming PCBNMI can be taking [6,6]-phenyl-C60-butyric-N-2-dimethylaminoethyl ester (0.05 g, 0.052 mmol) and dissolved it in dry THF (2 mL) under argon. Iodomethane (1.5 mL) was added in one portion and the vessel was sealed. The solution is then heated to 60° C. for 18 hours. The solution was cooled and opened to allow the liquids to evaporate. The solid residue was suspended in methanol, diluted with acetone, and centrifuged. This process was repeated to produce [6,6]-phenyl-C60-butyric-N-2-trimethylammonium ethyl ester iodide as a metallic green powder (0.05 g, ~99% yield).

The polymer and the acceptor, PC$_{70}$BM, ITIC-DF

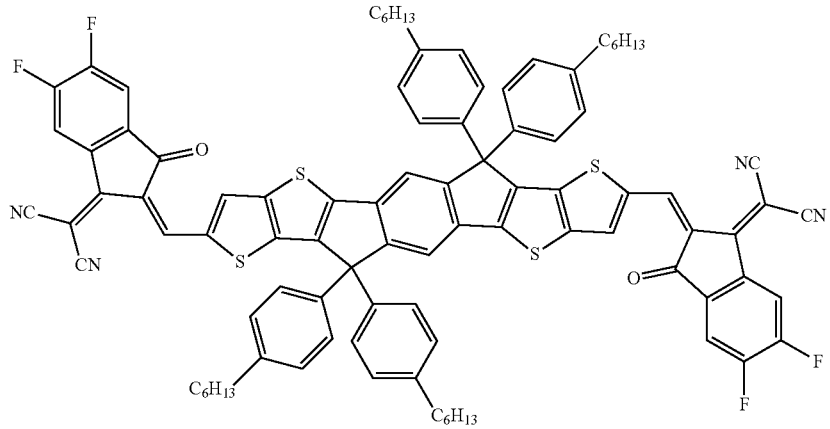

in a ratio of 1:1.2 were dissolved in chlorobenzene at the concentration of 26 mg/mL to obtain the photoactive layer solution. The solution was stirred and heated at 80° C. overnight in a nitrogen filled glove box. The next day 3.0 vol % of 1,8-diiodooctane (DIO) was added before spin-coating of the photoactive layer.

Figure 28A:
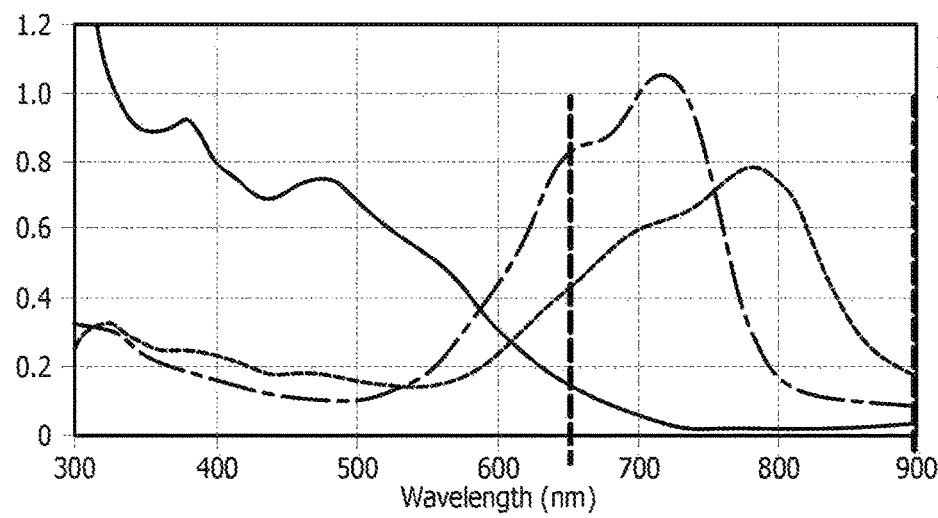
FIG. 28a depicts a comparison of absorption of polymers with different acceptors.
Figure 28B:
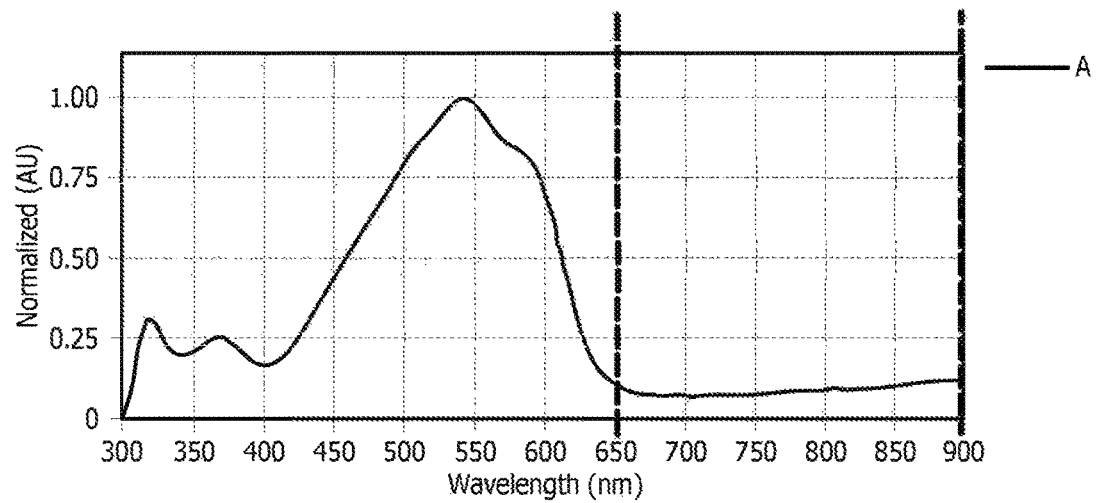
FIG. 28b depicts a comparison of absorption of polymers with different acceptors.
Figure 28C:
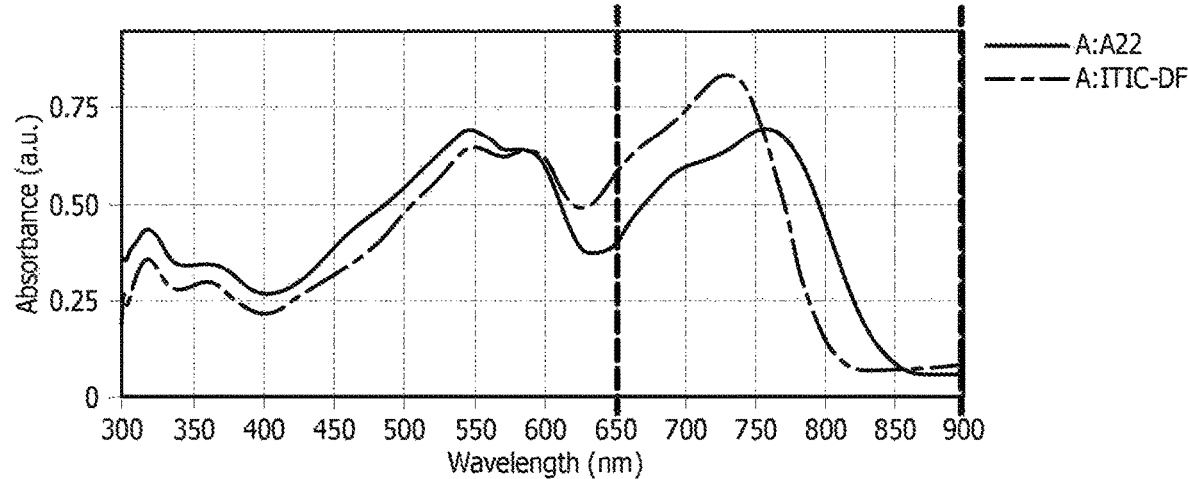
FIG. 28c depicts a comparison of absorption of polymers with different acceptors.

The UV-Visible absorption of the fluorinated semiconducting polymer A with different acceptors, ITIC-DF, and A22. is show in FIGS. 28A, 28B, and 28C as an example to study the electronic properties. The absorption is mainly between 450 nm to 650 nm, which is close to the peak of sunlight irradiation and is complimentary with the absorption for new non-fullerene acceptor (literature ITIC-DF and internal acceptor A22 are used as examples). The complimentary absorption of polymer and acceptor will enhance the OPV performance.

Indium tin oxide patterned glass substrates were cleaned by successive ultra-sonications in acetone and isopropanol. Each 15 min step was repeated twice, and the freshly cleaned substrates were left to dry overnight at 60° C. Preceding fabrication, the substrates were further cleaned for 1.5 min in a UV-ozone chamber and the electron transport layer was immediately spin coated on top.

Sol-gel electron transport layer solution was filtered directly onto the indium tin oxide with a 0.25 μm poly (vinylidene fluoride) filter and spin cast at 4000 rpm for 40 s. Films were then annealed at 170° C. for 15 min, and directly transferred into a nitrogen filled glove box.

The photoactive layer was deposited on the electron transport layer via spin coating at 600 rpm for 40 s with the solution and the substrate being preheated at 110° C. and directly transferred into a glass petri dish for overnight solvent annealing.

After annealing, the substrates were loaded into the vacuum evaporator where $MoO_3$ (hole transport layer) and Ag (anode) were sequentially deposited by thermal evaporation.

Deposition occurred at a pressure of $<4 \times 10^{-6}$ torr. $MoO_3$ and Ag had thicknesses of 5.0 nm and 120 nm, respectively. Samples were then encapsulated with glass using an epoxy binder and treated with UV light for 3 min.

In one example an organic photovoltaic device can be made with a polymer

Examples of polymerization reactions and polymers.

Non-limiting examples of polymers and the associated polymerization reactions needed to produce them as shown below.

Electron Transport Layer:

Zinc tin oxide (ZTO): phenyl-$C_{60}$-butyric acid-2-N,N,N-trimethylammonium iodide ethyl ester (PCBNMI) sol-gel solutions were prepared by adding zinc acetate dihydrate (996 mg), tin (II) acetate (99.6 mg), and PCBNOH (5 mg) to 2-methoxyethanol (10 mL) and ethanolamine (249 μL). Solutions were stirred for a minimum of 8 hours before use.

An Erichsen COATMASTER 510 was used to spread the electron transport layer on the large area ITO substrates. Approximately 300 μL of the zinc tin oxide:fullerene (ZTO: PCBNMI) sol-gel solution was drawn into a pipette and deposited without filtration, directly onto the ITO at room temperature.

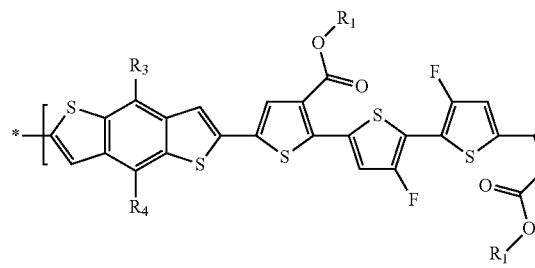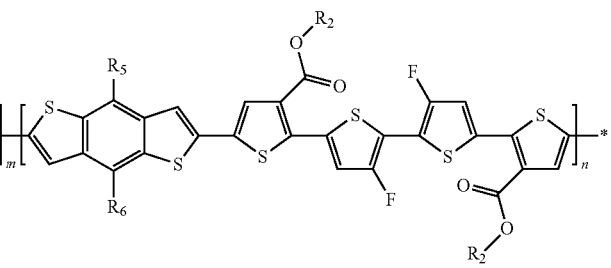

and a fullerene or a non-fullerene acceptor. In this embodiment, $R_1$, $R_2$, $R_3$, $R_4$, $R_5$ and $R_6$ are independently selected from the group consisting of: a halogen, a substituted alkyl, an unsubstituted alkyl, a substituted aryl, an unsubstituted aryl, a substituted heteroaryl and an unsubstituted heteroaryl.

In another embodiment, $R_3$ $R_4$, $R_5$, $R_6$ can be independently selected from

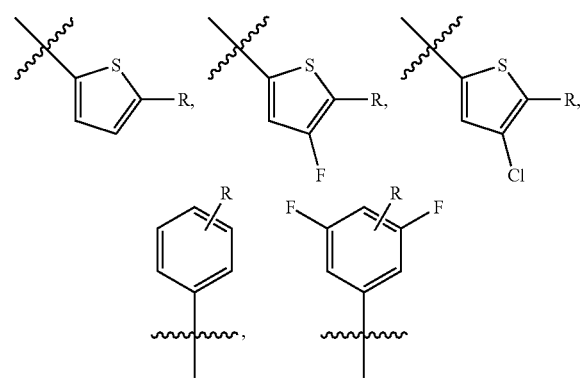

wherein R is independently selected from the group consisting of: a halogen, a substituted alkyl, an unsubstituted alkyl, a substituted aryl, an unsubstituted aryl, a substituted heteroaryl and an unsubstituted heteroaryl.

Polymer Synthesis

The polymerization can be any conventionally known method of combining the co-monomers, constitutional units or monomers bonded chain or network. In one non-limiting example polymerization can be via Stille cross coupling, Suzuki cross coupling or direct arylation polymerization. In another non-limiting example, the polymers created can be from 2 to 1,000,000 or even greater repeating units.

Table 1 below depicts the average device performance of the above mentioned polymers.

TABLE I

| Active Layer | Solvents | $V_{oc}$ (V) | $J_{sc}$ (mA/cm$^2$) | FF (%) | PCE (%) |
| --- | --- | --- | --- | --- | --- |
| A: ITIC-DF | CB | 0.78 | 22.3 | 73.4 | 12.6 |
| B: ITIC-DF | CB | 0.79 | 21.8 | 73.9 | 12.4 |
| C: ITIC-DF | CB | 0.89 | 22.7 | 74.0 | 15.0 |
| D: ITIC-DF | CB/DCB | 0.90 | 22.4 | 74.9 | 15.1 |
|  | Naphtha | 0.94 | 19.2 | 65.6 | 11.8 |
| E: ITIC-DF | CB | 0.92 | 21.1 | 75.2 | 14.3 |
|  | Naphtha | 0.94 | 19.0 | 62.9 | 11.2 |
| F: ITIC-DF | CB/DCB | 0.90 | 20.0 | 72.4 | 13.0 |
|  | Naphtha | 0.95 | 18.9 | 60.7 | 10.9 |

Device performance of OPVs using the active layer of A, B, C D, E, F blended with ITIC-DF processed in chlorobenzene (CB), chlorobenzene/dichlorobenzene (CB/DCB), Naphtha (Solvent naphtha (petroleum), light aromatic (CAS 64742-95-6)). In this table Jsc (mA/cm$^2$) Short-circuit current density (Jsc) is the current density that flows out of the solar cell at zero bias. $V_{oc}$ (V) Open-circuit voltage ($V_{oc}$) is the voltage for which the current in the external circuit is zero. Fill factor percentage (FF %) is the ratio of the maximum power point divided by the open circuit voltage and the short circuit current. PCE (%) The power conversion efficiency (PCE) of a photovoltaic cell is the percentage of the solar energy shining on a photovoltaic device that is converted into usable electricity.

Halogenated solvents such as chlorobenzene, dichlorobenzene or the mixture is often used in the process depositing photoactive layer films for organic solar cells. However, these solvents are discouraged from use in large scale roll-to-roll coating due to environmental and human toxicity concerns. A replacement solvent with cheap price and reliable source is important for the low-cost, roll-to-roll production of organic solar cell films.

Industrial solvents "Solvent naphtha (petroleum), light aromatic (CAS 64742-95-6) or solvent naphtha (coal) 65996-79-4)" are alternatives for coating solvents. Solvent naphtha (petroleum), light aromatic (CAS 64742-95-6) or solvent naphtha (coal) 65996-79-4) have representative components in hydrocarbons, C9, aromatics solvent is the mixture of 1,2,4-trimethylbenzene, 1,3,5-trimethylbenzene, ethyl-toluene mixed isomers and the aromatic solvent naphtha from petroleum. Solvent naphtha (petroleum), Solvent naphtha (petroleum), light aromatic (CAS 64742-95-6) is a complex combination of hydrocarbons obtained from distillation of aromatic streams. It consists predominantly of aromatic hydrocarbons having carbon numbers predominantly in the range of C8 through C10 and boiling in the range of approximately 135° C. to 210° C. (275° F. to 410° F.). Solvent naphtha (coal) 65996-79-4 is the distillate from either high temperature coal tar, coke oven light oil, or coal tar oil alkaline extract residue having an approximate distillation range of 130° C. to 210° C. (266 to 410° F.) Composed primarily of indene and other polycyclic ring systems containing a single aromatic ring. May contain phenolic compounds and aromatic nitrogen bases.

Both Solvent naphtha (petroleum), light aromatic (CAS 64742-95-6) or solvent naphtha (coal) 65996-79-4) are widely used by consumer in lubricants and greases adhesives and sealants, polishes and waxes, coating products, fillers, putties, plasters, modelling clay, anti-freeze products, finger paints and fertilizers. Professional workers even further spread the uses into coating products, fuels, lubricants and greases, plant protection products, washing & cleaning products, fertilizers, polymers and oil and gas exploration or production products. It is estimated that the annual worldwide production of Solvent naphtha (petroleum), light aromatic (CAS 64742-95-6) for solvent use at 500,00-250,000 metric tons. U.S. solvent applications are primarily industrial coatings/sealants, marine paint, wood deck sealer, and automotive applications such as fuel injection cleaner and fuel additive diluent. The above information proves that Solvent naphtha is a well-established in the coating industry and have a reliable source.

Other replacements for solvent can include solvents known to operate such as water, alcohols, diols, ketones, esters, ethers, aliphatic or alicyclic hydrocarbons, aromatic hydrocarbons, cyano-containing hydrocarbons, halogenated hydrocarbons, and others. Examples of the alcohols include methanol, ethanol, propanol, isopropyl alcohol, 1-butanol, isobutanol, 2-butanol, t-butanol, pentanol, isopentanol, 2-pentanol, neopentanol, t-pentanol, hexanol, 2-hexanol, heptanol, 2-heptanol, octanol, 2-ethylhexanol, 2-octanol, cyclopentanol, cyclohexanol, cycloheptanol, methylcyclopentanol, methylcyclohexanol, methylcycloheptanol, benzyl alcohol, ethylene glycol monomethyl ether, ethylene glycol monoethyl ether, propylene glycol monomethyl ether, propylene glycol monoethyl ether, diethylene glycol monomethyl ether, diethylene glycol monoethyl ether, triethylene glycol monomethyl ether, triethylene glycol monoethyl ether, 2-(N,N-dimethylamino)ethanol, and 3-(N,N-dimethylamino)propanol.

Examples of the diols include ethylene glycol, propylene glycol, 1,2-butanediol, 1,3-butanediol, 1,4-butanediol, 1,5-pentanediol, neopentyl glycol, isoprene glycol (3-methyl-1,3-butanediol), 1,2-hexanediol, 1,6-hexanediol, 3-methyl-1,5-pentanediol, 1,2-octanediol, octanediol (2-ethyl-1,3-hexanediol), 2-butyl-2-ethyl-1,3-propanediol, 2,5-dimethyl-2,5-hexanediol, 1,2-cyclohexanediol, 1,4-cyclohexanediol, and 1,4-cyclohexanedimethanol.

Examples of the ketones include acetone, ethyl methyl ketone, methyl isopropyl ketone, methyl butyl ketone, methyl isobutyl ketone, methyl amyl ketone, methyl hexyl ketone, ethyl butyl ketone, diethyl ketone, dipropyl ketone, diisobutyl ketone, methyl amyl ketone, cyclohexanone, and methylcyclohexanone.

Examples of the esters include methyl formate, ethyl formate, methyl acetate, ethyl acetate, isopropyl acetate, butyl acetate, isobutyl acetate, s-butyl acetate, t-butyl acetate, amyl acetate, isoamyl acetate, t-amyl acetate, phenyl acetate, methyl propionate, ethyl propionate, isopropyl propionate, butyl propionate, isobutyl propionate, s-butyl propionate, t-butyl propionate, amyl propionate, isoamyl propionate, t-amyl propionate, phenyl propionate, methyl 2-ethylhexanoate, ethyl 2-ethylhexanolate, propyl 2-ethylhexanoate, isopropyl 2-ethylhexanoate, butyl 2-ethylhexanoate, methyl lactate, ethyl lactate, methyl methoxypropionate, methyl ethoxypropionate, ethyl methoxypropionate, ethyl ethoxypropionate, ethylene glycol monomethyl ether acetate, diethylene glycol monomethyl ether acetate, ethylene glycol monoethyl ether acetate, ethylene glycol monopropyl ether acetate, ethylene glycol monoisopropyl ether acetate, ethylene glycol monobutyl ether acetate, ethylene glycol mono-s-butyl ether acetate, ethylene glycol monoisobutyl ether acetate, ethylene glycol mono-t-butyl ether acetate, propylene glycol monomethyl ether acetate, propylene glycol monoethyl ether acetate, propylene glycol monopropyl ether acetate, propylene glycol monoisopropyl ether acetate, propylene glycol monobutyl ether acetate, propylene glycol mono-s-butyl ether acetate, propylene glycol monoisobutyl ether acetate, propylene glycol mono-t-butyl ether acetate, butylene glycol monomethyl ether acetate, butylene glycol monoethyl ether acetate, butylene glycol monopropyl ether acetate, butylene glycol monoisopropyl ether acetate, butylene glycol monobutyl ether acetate, butylene glycol mono-s-butyl ether acetate, butylene glycol monoisobutyl ether acetate, butylene glycol mono-t-butyl ether acetate, methyl acetoacetate, ethyl acetoacetate, methyl oxobutanoate, ethyl oxobutanoate, γ-lactone, dimethyl malonate, dimethyl succinate, propylene glycol diacetate, and δ-lactone.

Examples of the ethers include tetrahydrofuran, tetrahydropyran, morpholine, ethylene glycol dimethyl ether, diethylene glycol dimethyl ether, dipropylene glycol dimethyl ether, triethylene glycol dimethyl ether, dibutyl ether, diethyl ether, and dioxane.

Examples of the aliphatic or alicyclic hydrocarbons include pentane, hexane, cyclohexane, methylcyclohexane, dimethylcyclohexane, ethylcyclohexane, heptane, octane, decaline, solvent naphtha, terpene oil, D-limonene, pinene, mineral spirit, Swasol 310 (from Cosmo Oil), and Solvesso 100 (from Exxon Chemical).

Examples of the aromatic hydrocarbons include benzene, toluene, ethylbenzene, xylene, mesitylene, diethylbenzene, cumene, isobutylbenzene, cymene, and tetralin.

Examples of the cyano-containing hydrocarbons include acetonitrile, 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene.

Examples of the halogenated hydrocarbons include carbon tetrachloride, chloroform, trichloroethylene, chlorobenzene, dichlorobenzene, and trichlorobenzene.

The other organic solvents include N-methyl-2-pyrrolidone, dimethyl sulfoxide, dimethylformamide, aniline, triethylamine, pyridine, and carbon disulfide.

Of these organic solvents preferred are chloroform, dichloromethane, toluene, xylene, chlorobenzene, dichlorobenzene, and trichlorobenzene.

Overall, with the replacement of fluorine atom with chlorine atom, the solubility of polymer D could be processed in Solvent naphtha (petroleum), light aromatic (CAS 64742-95-6) with 12.7% and 11.8% efficiencies obtained. The copolymer E and F is also processable in Solvent naphtha (petroleum), light aromatic (CAS 64742-95-6) with (12.8% and 11.2% for E) and (11.9% and 10.9% for F) efficiencies obtained. This process is important for the large scale coating of the photoactive layer in reduced toxicity solvents.

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. An organic photovoltaic device comprising:
a polymer:

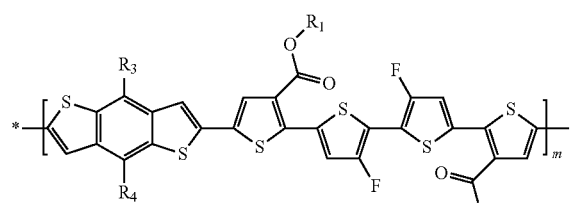

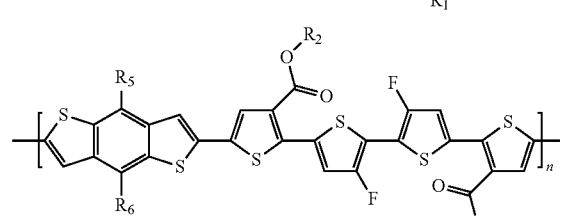

and an acceptor, wherein $R_1$, $R_2$, $R_3$, $R_4$, $R_5$ and $R_6$ are independently selected from the group consisting of:

a halogen, a substituted alkyl, an unsubstituted alkyl, a substituted aryl, an unsubstituted aryl, a substituted heteroaryl and an unsubstituted heteroaryl, wherein the ratio of m is between 0.6 to 0.8 and n is between 0.2 and 0.4.

2. The organic photovoltaic device of claim 1, wherein the acceptor is a fullerene acceptor.

3. The organic photovoltaic device of claim 1, wherein the acceptor is a non-fullerene acceptor.

4. The organic photovoltaic device of claim 1, wherein $R_3$ $R_4$, $R_5$, $R_6$ are independently selected from

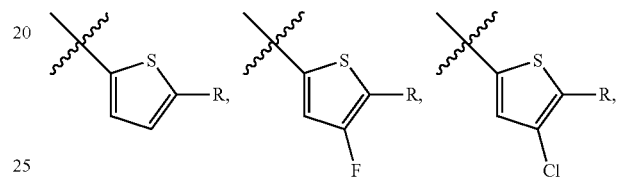

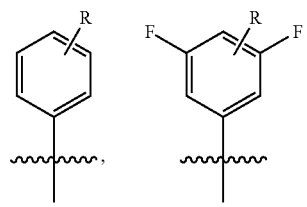

wherein R is independently selected from the group consisting of: a halogen, a substituted alkyl, an unsubstituted alkyl, a substituted aryl, an unsubstituted aryl, a substituted heteroaryl and an unsubstituted heteroaryl.

5. An organic photovoltaic device comprising:
a polymer:

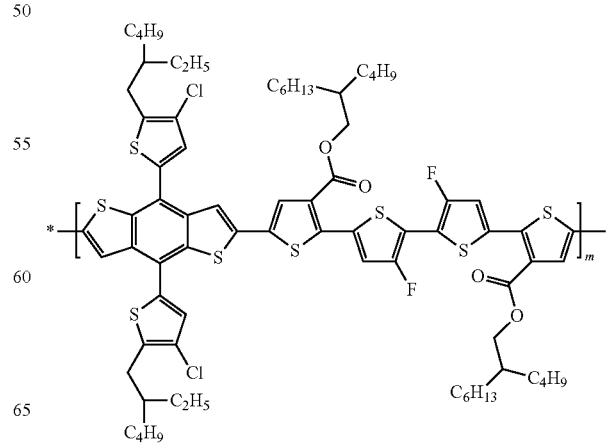

-continued
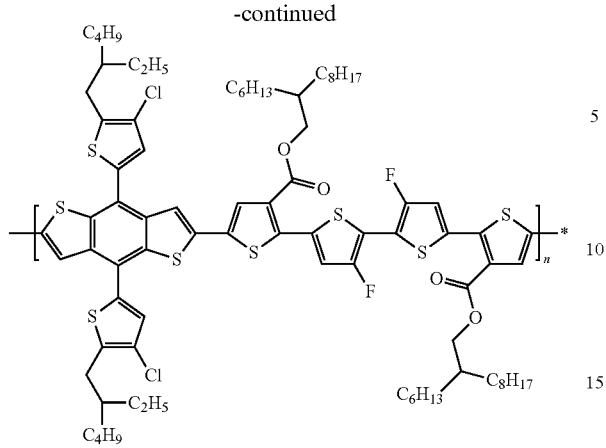
and an acceptor,
wherein the polymer was formed in a naptha solvent,
wherein the ratio of m is between 0.6 to 0.8 and n is between 0.2 and 0.4.
* * * * *